(12) United States Patent
Tezuka et al.

(10) Patent No.: US 8,174,670 B2
(45) Date of Patent: May 8, 2012

(54) MEASUREMENT METHOD AND EXPOSURE APPARATUS

(75) Inventors: Taro Tezuka, Utsunomiya (JP); Yoshiyuki Kuramoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 345 days.

(21) Appl. No.: 12/419,931

(22) Filed: Apr. 7, 2009

(65) Prior Publication Data
US 2009/0268181 A1 Oct. 29, 2009

(30) Foreign Application Priority Data
Apr. 24, 2008 (JP) .................. 2008-114415

(51) Int. Cl.
*G03B 27/68* (2006.01)
(52) U.S. Cl. .......................... 355/52; 355/67
(58) Field of Classification Search .............. 355/52, 355/55, 57, 60, 77; 356/124, 512, 515
See application file for complete search history.

(56) References Cited

U.S. PATENT DOCUMENTS
6,937,345 B2  8/2005 Kuramoto
2002/0057495 A1* 5/2002 Kuramoto ............. 359/618

FOREIGN PATENT DOCUMENTS
JP  3352298 B2  12/2002
JP  3728187 B2  12/2005

* cited by examiner

*Primary Examiner* — Glen Kao
(74) *Attorney, Agent, or Firm* — Canon USA Inc IP Division

(57) ABSTRACT

A method of measuring an optical characteristic of an optical system using a measurement apparatus, comprises determining a position of each of object points by arranging, on a side of the object plane, an object point measurement device array, and sequentially inserting the object point measurement devices in an optical path, determining a position of each of image points by arranging, on a side of the image plane, an image point measurement device array, and sequentially inserting the image point measurement devices in the optical path, calculating an error attributed to the measurement apparatus based on the positions of object points and the positions of the image points, obtaining a measured value by measurement to obtain information representing the optical characteristic of the optical system using the measurement apparatus, and correcting the measured value based on the error.

12 Claims, 19 Drawing Sheets

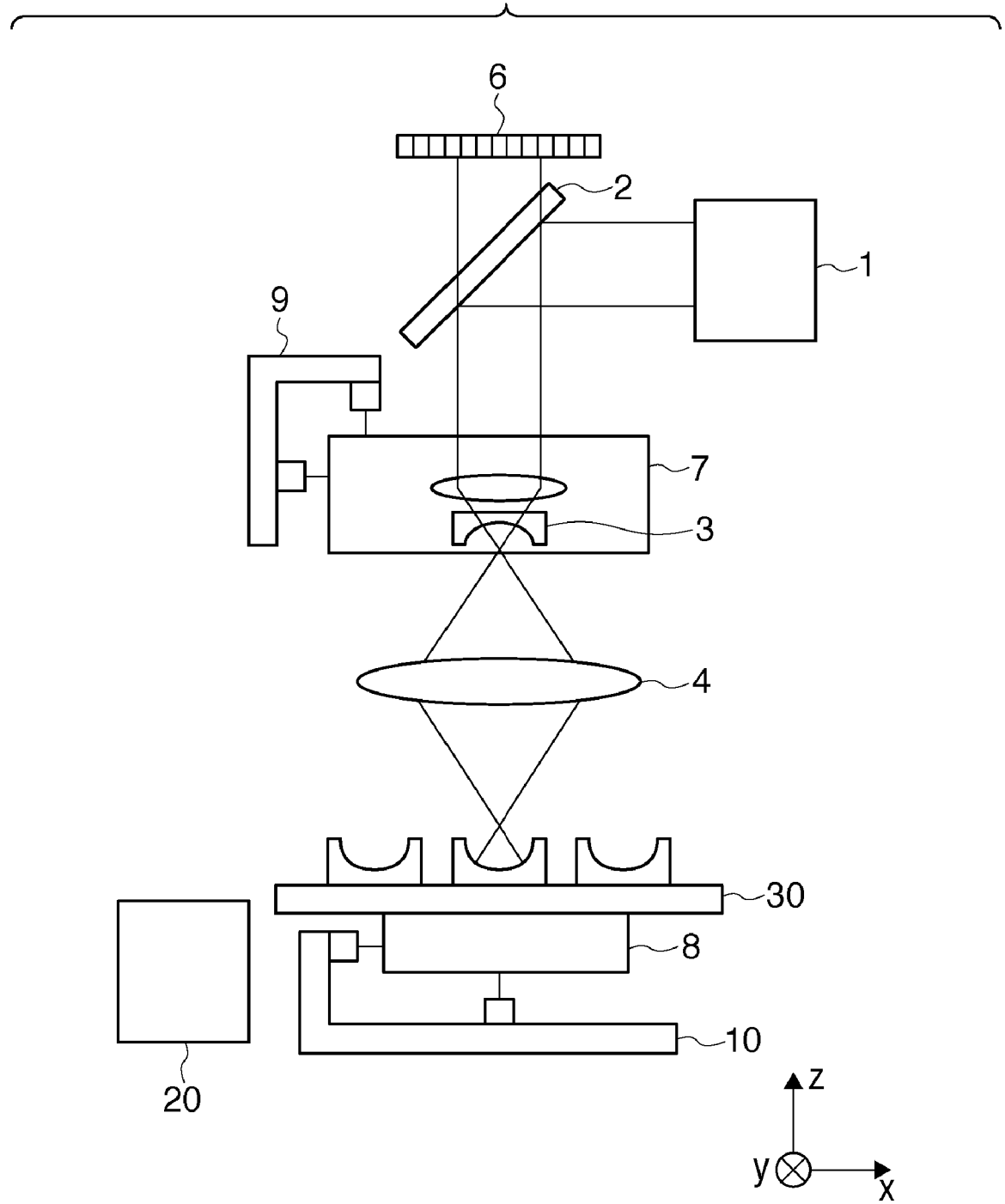
F I G. 2B

MEASUREMENT METHOD AND EXPOSURE APPARATUS

BACKGROUND OF THE INVENTION

1. Field of the Invention

The present invention relates to a method of measuring the optical characteristic of an optical system, and an exposure apparatus having an arrangement suitable for the measurement method.

2. Description of the Related Art

In recent years, the tolerance of the overlay accuracy of an exposure apparatus has decreased to the degree that an overlay accuracy of 10 nm or less is required.

Under the circumstance, the measurement accuracy of the distortion aberration, of a projection optical system is also being required to be 10 nm or less. An example of a distortion aberration measurement method will be explained herein. First, a point source is set at a first position in the object plane of an optical system to be measured, and the position of an image of the point source is measured on the image plane side of the optical system. At this time, the position of the point source on the object side is acquired at once.

Next, a point source is set at a second position in the object plane of the optical system to be measured, and the position of an image of the point source on the image plane side and that of the point source on the object side are acquired in the same way. This operation is repeated a plurality of times to acquire the positions of a plurality of image points corresponding to those of a plurality of object points. Finally, calculating a misalignment between the position of an ideal image point and the measured position of each image point makes it possible to measure the distortion aberration. It is possible to measure the field curvature associated with the distortion of the image plane in the optical axis direction by the same method.

Japanese Patent Nos. 3352298 and 3728187 describe a method of calculating the distortion aberration and the field curvature by configuring a wavefront measurement interferometer using a Fizeau interferometer, and measuring the positions of object and image points using the position coordinates of the TS focus and the center of curvature of the RS, and a value calculated from the tilt and spherical component of the wavefront.

To measure the distortion aberration and the field curvature mentioned above, it is necessary to precisely measure the positions of object points in the optical system to be measured, and the positional relationship between the object and image points. A position measurement error at each measurement point is a misalignment of the image point with respect to the object point, which appears as the distortion aberration and the field curvature, resulting in deterioration in the measurement accuracy. Position measurement errors may occur in stage position measurement systems which measure the positions of an object-side stage for moving the object point, and an image-side stage for moving an image point measurement device (e.g., the RS of the Fizeau interferometer). Detailed causes for the position measurement errors include, e.g., orthogonality errors of the measurement systems, a shape error of a reference mirror when a laser interferometer is used, and drifts and fluctuations in the surrounding environmental factors such as the temperature.

SUMMARY OF THE INVENTION

The present invention provides a method of accurately measuring, for example, the optical characteristic of an optical system while reducing any errors attributed to a measurement apparatus, and an exposure apparatus having an arrangement suitable for the measurement method.

One of the aspects of the present invention provides a method of measuring an optical characteristic of an optical system using a measurement apparatus, the method comprises the steps of determining a position of each of object points by arranging, on a side of an object plane of the optical system, an object point measurement device array in which a plurality of object point measurement devices are arranged, and sequentially inserting the plurality of object point measurement devices in an optical path, determining a position of each of image points by arranging, on a side of an image plane of the optical system, an image point measurement device array in which a plurality of image point measurement devices are arranged, and sequentially inserting the plurality of image point measurement devices in the optical path, calculating an error attributed to the measurement apparatus based on the positions of object points and the positions of the image points, obtaining a measured value by measurement to obtain information representing the optical characteristic of the optical system using the measurement apparatus, and correcting the measured value based on the error.

Further features of the present invention will become apparent from the following description of exemplary embodiments with reference to the attached drawings.

BRIEF DESCRIPTION OF THE DRAWINGS

FIG. 2B is a view exemplifying the measurement method according to the first embodiment of the present invention;

DESCRIPTION OF THE EMBODIMENTS

Figure 1:
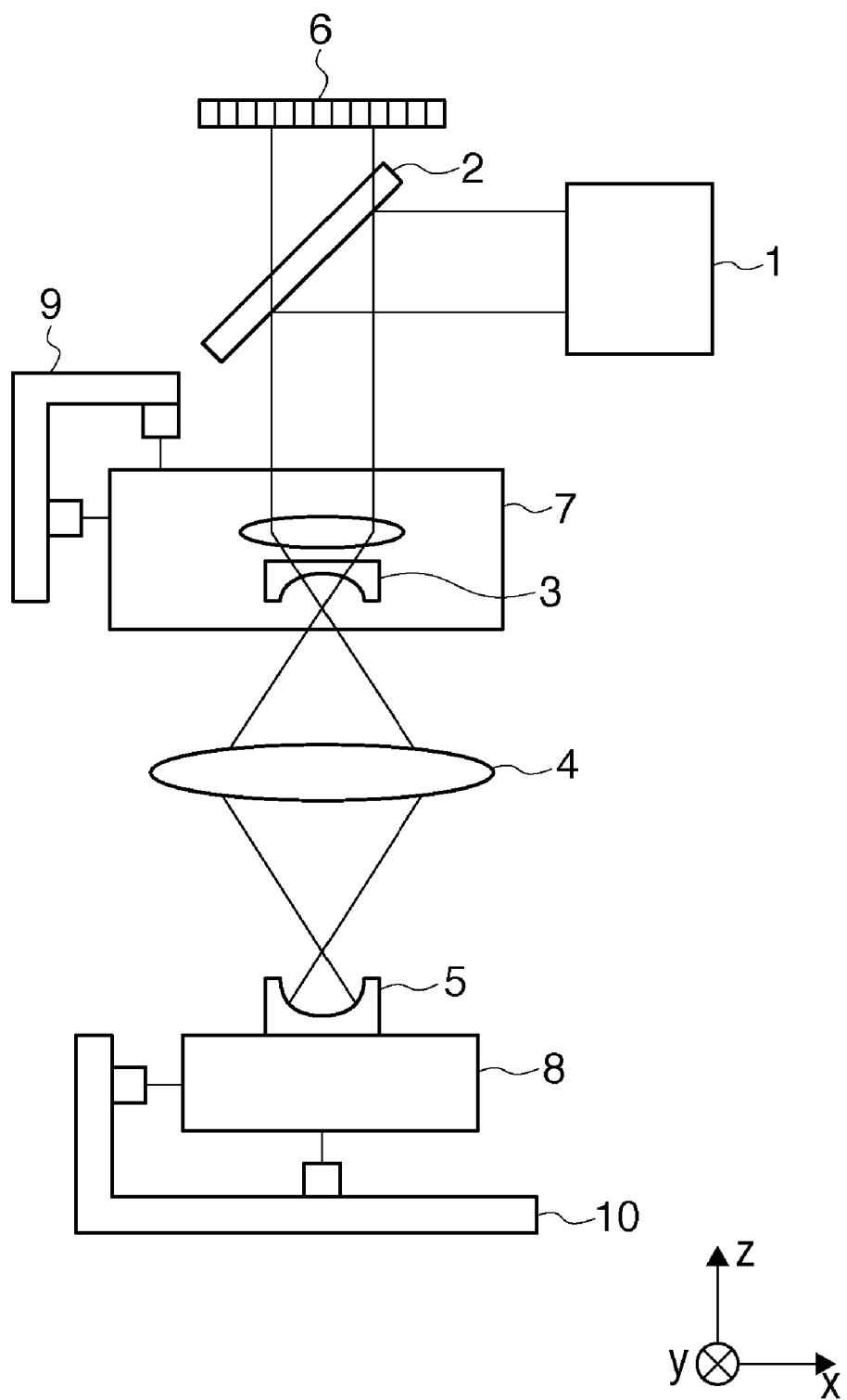
FIG. 1 is a view for explaining a general method of measuring the optical characteristic of an optical system to be measured.

Preferred embodiments of the present invention will be described below with reference to the accompanying drawings. Note that the same reference numerals denote the same elements throughout the drawings.

A general principle of measuring the distortion aberration and the field curvature will be explained first with reference to FIG. 1. The distortion aberrations are defined herein as the amounts of errors in the x and y directions between an ideal imaging position and an actual imaging position. Details of this definition are as follows. Error amounts Dx and Dy in the x and y directions, respectively, as the distortion aberrations are given by:

$$Dx = Imx - Icx \qquad (1)$$
$$= Imx - \beta * Omx$$

$$Dy = Imy - Icy \qquad (2)$$
$$= Imy - \beta * Omy$$

where Omx and Omy are the x- and y-coordinates of the measured object point, $\beta$ is an ideal imaging magnification, Icx and Icy are the x- and y-coordinates of an ideal image point, and Imx and Imy are the x- and y-coordinates of the measured image point.

A measurement apparatus shown in FIG. 1 includes a Fizeau interferometer configured for an optical system 4 to be measured. A photodetector 6 is used to observe interference fringes formed by reference light which is emitted by a light source 1 and reflected by the final surface of a TS lens 3 via a half mirror 2, and light which is reflected by an RS mirror 5 via the optical system 4. The position of an object point to be evaluated in the optical system 4 can be changed by driving an object-side stage 7. Analyzing the obtained interference fringes makes it possible to calculate the amount of misalignment of the center of curvature of the RS mirror 5 with respect to the image point based on the wavefront of the optical system 4 and the tilt and spherical component of the interference fringes. The position of the image point can be determined or calculated based on the amount of misalignment and the position of an image-side stage 8.

The distortion aberrations Dx and Dy are calculated in accordance with equations (1) and (2) by measuring the positions Omx and Omy of the object point by a position measurement system 9 of the object-side stage 7, and measuring the positions Imx and Imy of the image point by a position measurement system 10 of the image-side stage 8 and the interference fringes observed by the photodetector 6. In general, the object-side stage 7 and the image-side stage 8 are driven to measure distortion aberrations Dxi and Dyi (i is the measurement position number) at positions Omxi and Omyi of a plurality of object points within the range of an object height to be evaluated, thereby obtaining the image height characteristics of the distortion aberrations.

First Embodiment

The first embodiment of the present invention will be explained with reference to FIGS. 2A, 2B, 3A, and 3B. Distortion aberration measurement according to the first embodiment of the present invention reduces any errors attributed to a measurement apparatus corresponding to the magnification components of the distortion aberrations of an optical system to be measured (i.e., any errors attributed to a measurement apparatus, which appear as those of the magnification components). Distortion aberrations Dx and Dy of the optical system to be measured are given by:

$$Dx = C \cdot x \qquad (3)$$

$$Dy = C \cdot y \qquad (4)$$

where x and y are the x and y image heights in the image plane, and C is a coefficient representing the magnification component of each distortion aberration.

The procedure of the distortion aberration measurement method according to this embodiment will be explained below. Note that the following control and arithmetic operation for the measurement can be executed by a processor 20.

Figure 2A:
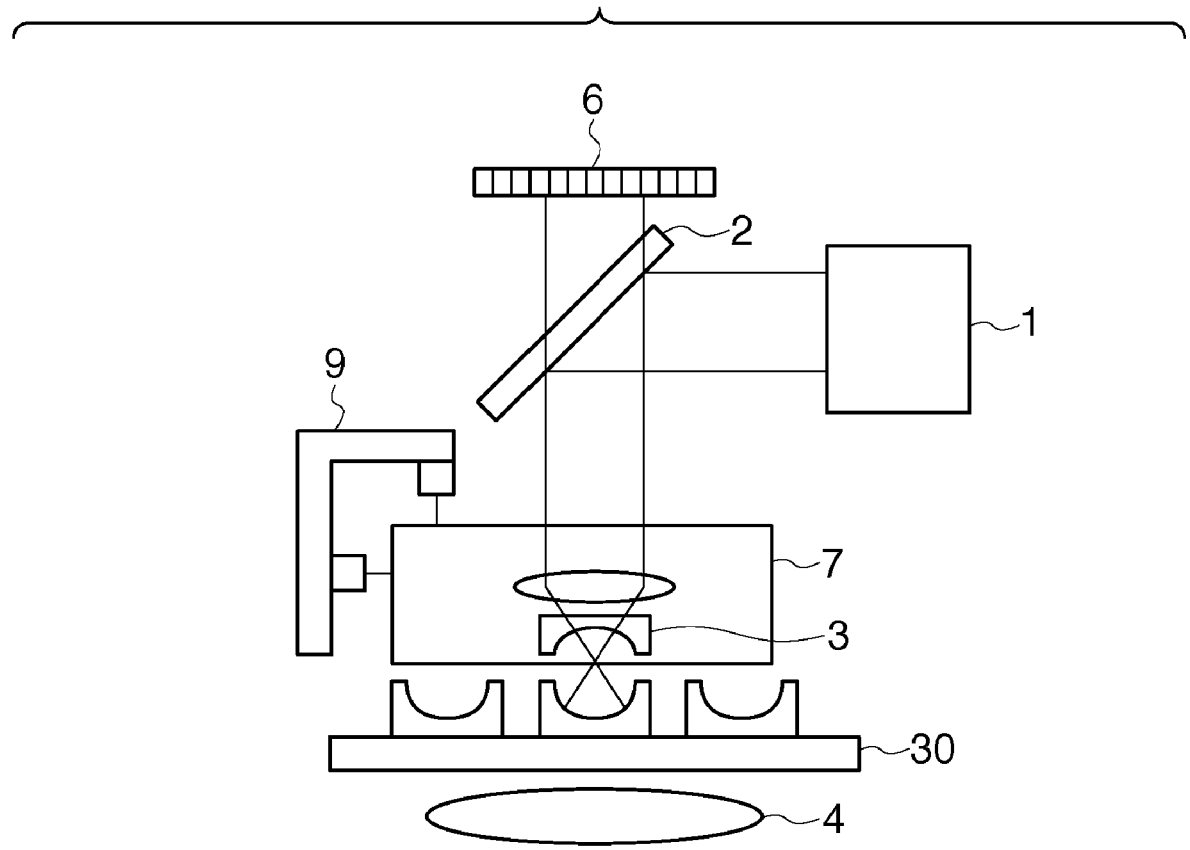
FIG. 2A is a view exemplifying a measurement method according to the first embodiment of the present invention.
Figure 2A:
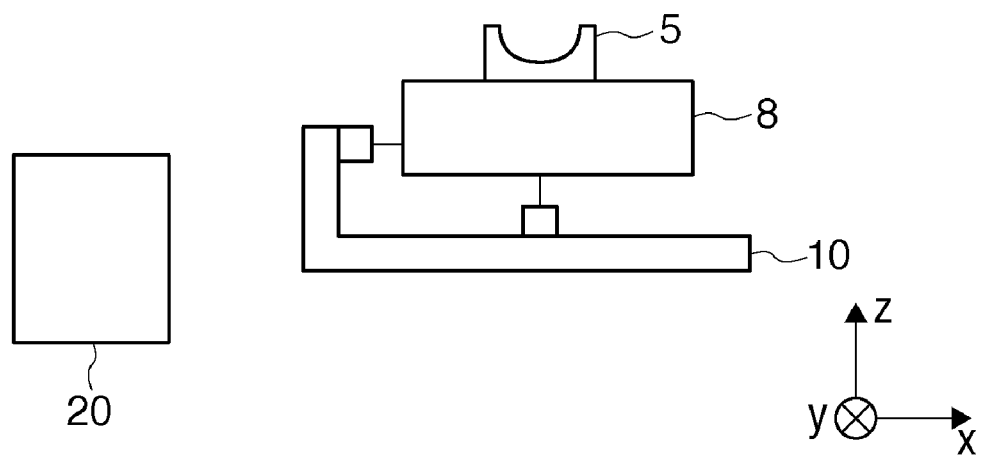
Figure 3A:
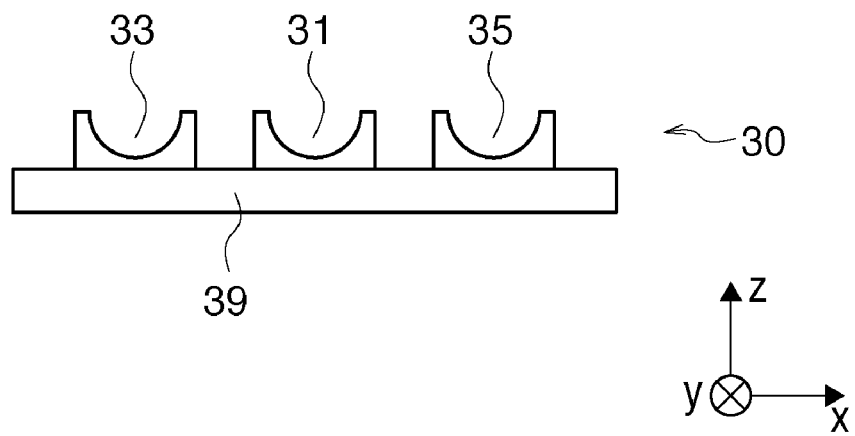
FIGS. 3A and 3B are views illustrating a configuration example of a reflective spherical mirror array suitable for the measurement method according to the first embodiment of the present invention.
Figure 3B:
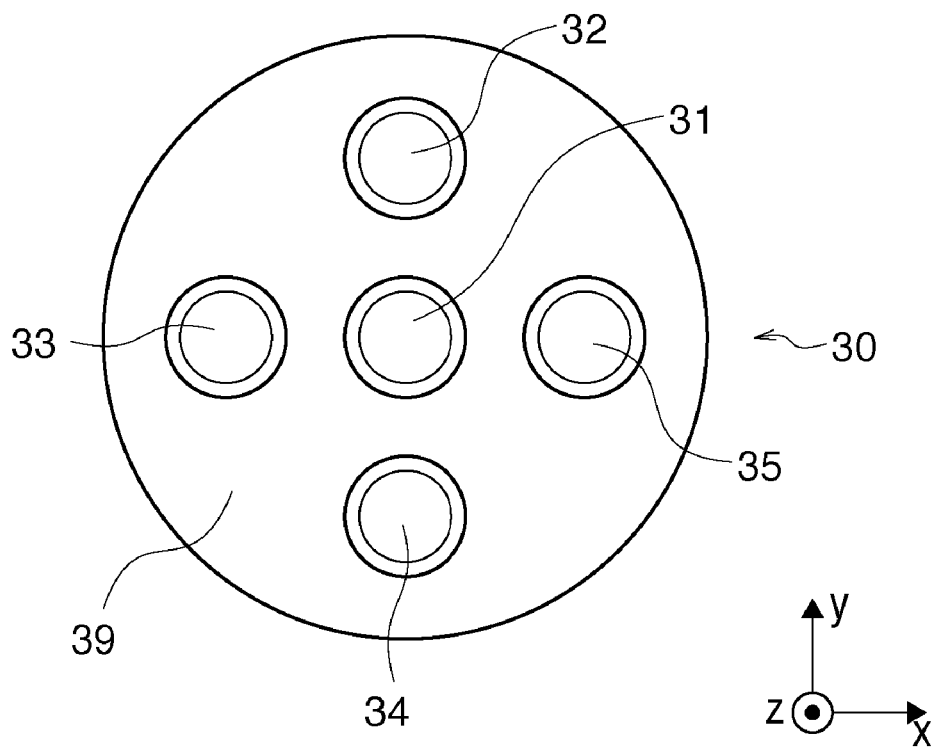

First, a reflective spherical mirror array (RS mirror array) 30 serving as an object point measurement device array is arranged on the object plane side, as shown in FIG. 2A. Note that the reflective spherical mirror array 30 has a structure in which a plurality of reflective spherical mirrors (RS mirrors) 31 to 35 serving as object point measurement devices are arranged on a flat plate (support body) 39 while being fixed in positions. The reflective spherical mirror array 30 is arranged such that the center of curvature of the reflective spherical mirror 31 set at the center of the reflective spherical mirror array 30 is aligned on the axis of an optical system 4. The plurality of reflective spherical mirrors 31 to 35 are arranged such that the centers of curvature of the reflective spherical mirrors 33, 31, and 35 align themselves on a first straight line (a straight line along the X-axis) at an equal interval, and those of the reflective spherical mirrors 32, 31, and 34 align themselves on a second straight line (a straight line along the Y-axis) at an equal interval, as shown in FIGS. 3A and 3B. The first and second straight lines are orthogonal to each other. The specifications of the reflective spherical mirror array 30, such as the number and arrangement of reflective spherical mirrors, are not limited to those shown in FIGS. 3A and 3B.

Second, an object-side stage 7 is translationally moved (driven) to set the position of the center of curvature of the reflective spherical mirror 31 as an object point to be measured. The interference fringes observed by a photodetector 6 are analyzed to determine or calculate an object-side stage position Oh31(x, y, z) corresponding to the position of the center of curvature of the reflective spherical mirror 31 based on the values measured by an position measurement system 9 and the analyzed value of the interference fringes. Note that the object-side stage position is equivalent to the position of the center of curvature of the reflective spherical mirror in the object plane.

Third, the center of curvature of the reflective spherical mirror 32 in the reflective spherical mirror array 30 is set as an object point to be measured. An object-side stage position Oh3(x, y, z) corresponding to the position of the center of curvature of the reflective spherical mirror 32 is determined or calculated in the same way as above. The centers of curvature of the reflective spherical mirrors 33, 34, and 35 are sequentially inserted in the optical path and set as object points to be measured to determine or calculate object-side stage positions Oh33, Oh34, and Oh35 corresponding to the positions of the centers of curvature of them.

Fourth, the reflective spherical mirror array 30 is moved to the image plane side and arranged such that the center of curvature of the reflective spherical mirror 31 is aligned on the axis of the optical system 4, as shown in FIG. 2B. In this arrangement, measurement light passes through the optical system 4, strikes a reflective spherical mirror in the reflective spherical mirror array 30, is reflected by the reflective spherical mirror, passes through the optical system 4 again, and interferes with light reflected by a TS lens 3, thereby forming interference fringes.

Fifth, the object-side stage 7 is driven to the position at which the object point to be measured is aligned on the axis of the optical system 4. In this state, an image-side stage 8 is driven to match the center of curvature of the reflective spherical mirror 31 in the reflective spherical mirror array 30 with an image point in the optical path, thereby observing the interference fringes in the optical system 4. An image-side stage position Ih31(x, y, z) corresponding to the position of the center of curvature of the reflective spherical mirror 31 is determined or calculated based on the analysis result of the interference fringes and the values measured by an image-side position measurement system 10. Note that the image-side stage position is equivalent to the position of the center of curvature in the image plane. Image-side stage positions Ih32, . . . Ih35 corresponding to the positions of the centers of curvature of the reflective spherical mirrors 32, . . . , 35 are determined or calculated by the same method. At this time, the position of the object point is adjusted by driving the object-side stage 7 so as to set the position of the center of curvature of a corresponding one of the reflective spherical mirrors 32, . . . , 35 as an image point.

Because the identical reflective spherical mirror arrays 30 are arranged on both the object and image sides, the relative position between two reflective spherical mirrors measured on the object side must be equal to that between these two reflective spherical mirrors measured on the image side unless the measurement system has any errors. An error of the measurement apparatus corresponding to the magnification component of each distortion aberration of the optical system 4 can be determined or calculated as a coefficient Csys at which a coherency σ given by:

$$\sigma = \{(Oh32(x) - Oh31(x)) - (Ih32(x) - Ih31(x)) - Csys \cdot (Ih32(x) - Ih31(x))\}^2 + \\
\{(Oh32(y) - Oh31(y)) - (Ih32(y) - Ih31(y)) - Csys \cdot (Ih32(y) - Ih31(y))\}^2 + \\
\{(Oh35(x) - Oh31(x)) - (Ih35(x) - Ih31(x)) - Csys \cdot (Ih35(x) - Ih31(x))\}^2 + \\
\{(Oh35(y) - Oh31(y)) - (Ih35(y) - Ih31(y)) - Csys \cdot (Ih35(y) - Ih31(y))\}^2 \quad (5)$$

is minimum.

Sixth, measurement to obtain information representing the distortion aberrations (optical characteristics) of the optical system 4 is executed using the reflective spherical mirror 31 in the configuration shown in FIG. 2B in accordance with the method explained with reference to FIG. 1 to obtain measured values.

Lastly, the measured values are corrected based on the errors of the measurement apparatus to determine or calculate distortion aberrations (optical characteristics) in which any errors are reduced. More specifically, distortion aberrations Dx(x, y) and Dy(x, y) of the optical system 4, in which any errors of the magnification components attributed to the measurement apparatus are reduced, are determined or calculated by:

$$Dx(x,y) = Dxm(x,y) - Csys \cdot x \quad (6)$$

$$Dy(x,y) = Dym(x,y) - Csys \cdot y \quad (7)$$

where Dxm(x, y) and Dym(x, y) are the measured values of the distortion aberrations at each image height.

Second Embodiment

The second embodiment of the present invention will be explained with reference to FIGS. 4A, 4B, 5A, and 5B. A distortion aberration measurement method according to the second embodiment of the present invention can reduce any errors of an object-side stage position measurement system 9 corresponding to the directional magnification difference components of the distortion aberrations of an optical system, which are given by:

$$Dx = Ec \cdot x + Es \cdot y \quad (8)$$

$$Dy = Es \cdot x - Ec \cdot y \quad (9)$$

where x and y are the x and y image heights, and Ec and Es are coefficients representing the directional magnification difference components of the distortion aberrations.

The measurement procedure will be explained below.

Figure 4A:
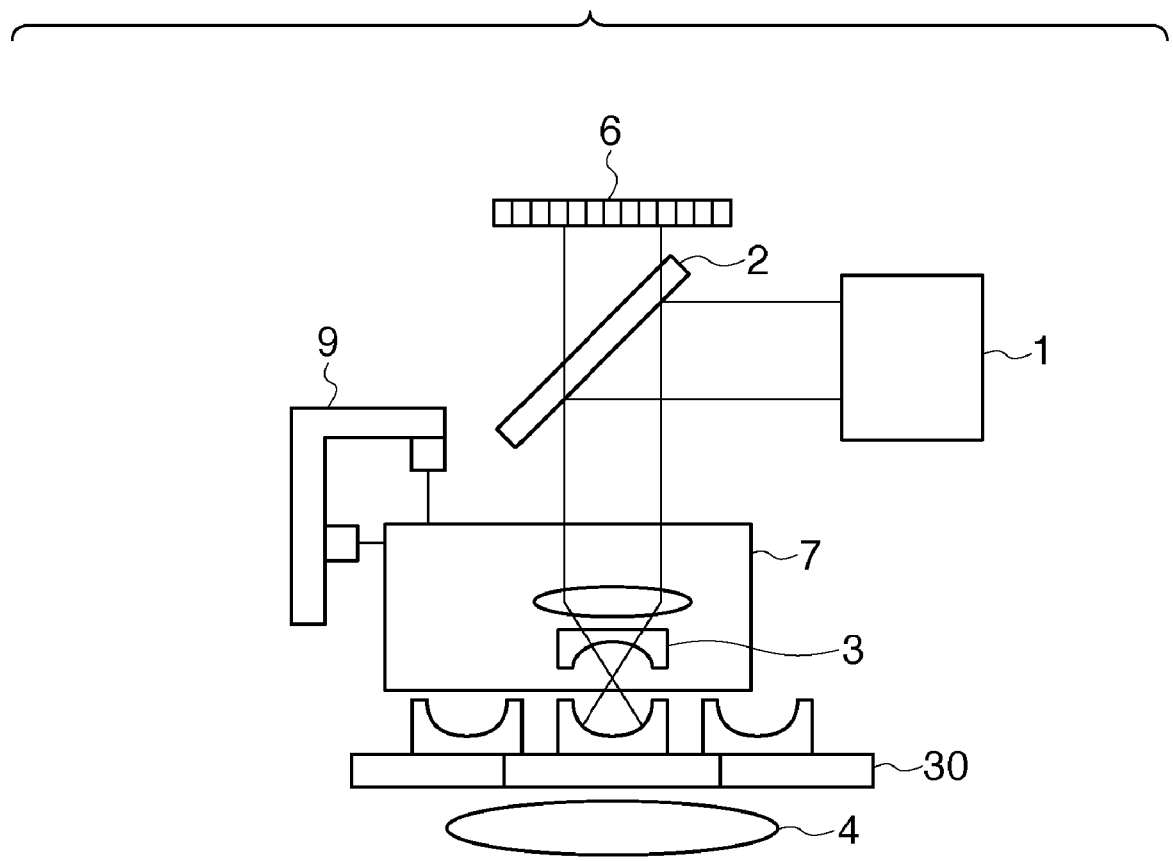
FIG. 4A is a view exemplifying a measurement method according to the second embodiment of the present invention.
Figure 4A:
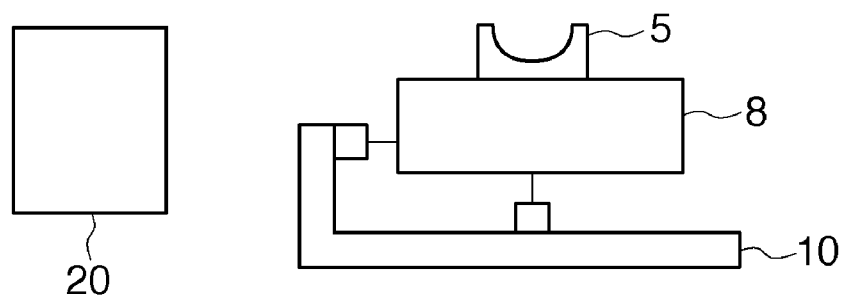
Figure 4A:
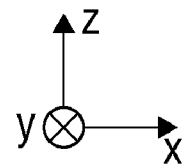

First, a reflective spherical mirror array 50 serving as an object point measurement device array is arranged on the object side of an optical system 4, as shown in FIG. 4A. Note that the reflective spherical mirror array 50 has a structure in which a plurality of reflective spherical mirrors 51, . . . , 55 serving as object point measurement devices are arranged on a flat plate (support body) 59 while being fixed in positions. The reflective spherical mirror array 50 is arranged such that the center of curvature of the reflective spherical mirror 51 set at the center of the reflective spherical mirror array 50 is aligned on the axis of the optical system 4.

The angle indicating the direction of the reflective spherical mirror array 50 or reflective spherical mirrors 51, . . . , 55 at this time is assumed to be 0°. The plurality of reflective spherical mirrors 51 to 55 are arranged such that the centers of curvature of the reflective spherical mirrors 53, 51, and 55 align themselves on a first straight line at an equal interval, and those of the reflective spherical mirrors 52, 51, and 54 align themselves on a second straight line at an equal interval. The first and second straight lines are orthogonal to each other. The specifications of the reflective spherical mirror array 50, such as the number and arrangement of reflective spherical mirrors, are not limited to those shown in FIGS. 5A and 5B.

Second, an object-side stage 7 is driven to set the center of curvature of the reflective spherical mirror 51 as an object point to be measured. The interference fringes observed by a photodetector 6 are analyzed to determine or calculate an object-side stage position Oh510(x, y, z) corresponding to the position of the center of curvature of the reflective spherical mirror 51 based on the values measured by the object-side stage position measurement system 9 and the analyzed value of the interference fringes.

Third, the center of curvature of the reflective spherical mirror 52 in the reflective spherical mirror array 50 is set as an object point to be measured. An object-side stage position Oh520 corresponding to the position of the center of curvature of the reflective spherical mirror 52 is determined or calculated in the same way as above. The centers of curvature of the reflective spherical mirrors 53, 54, and 55 are sequentially set as object points to be measured to determined or calculate object-side stage positions Oh530, Oh540, and Oh550 corresponding to the positions of the centers of curvature of them.

Figure 4B:
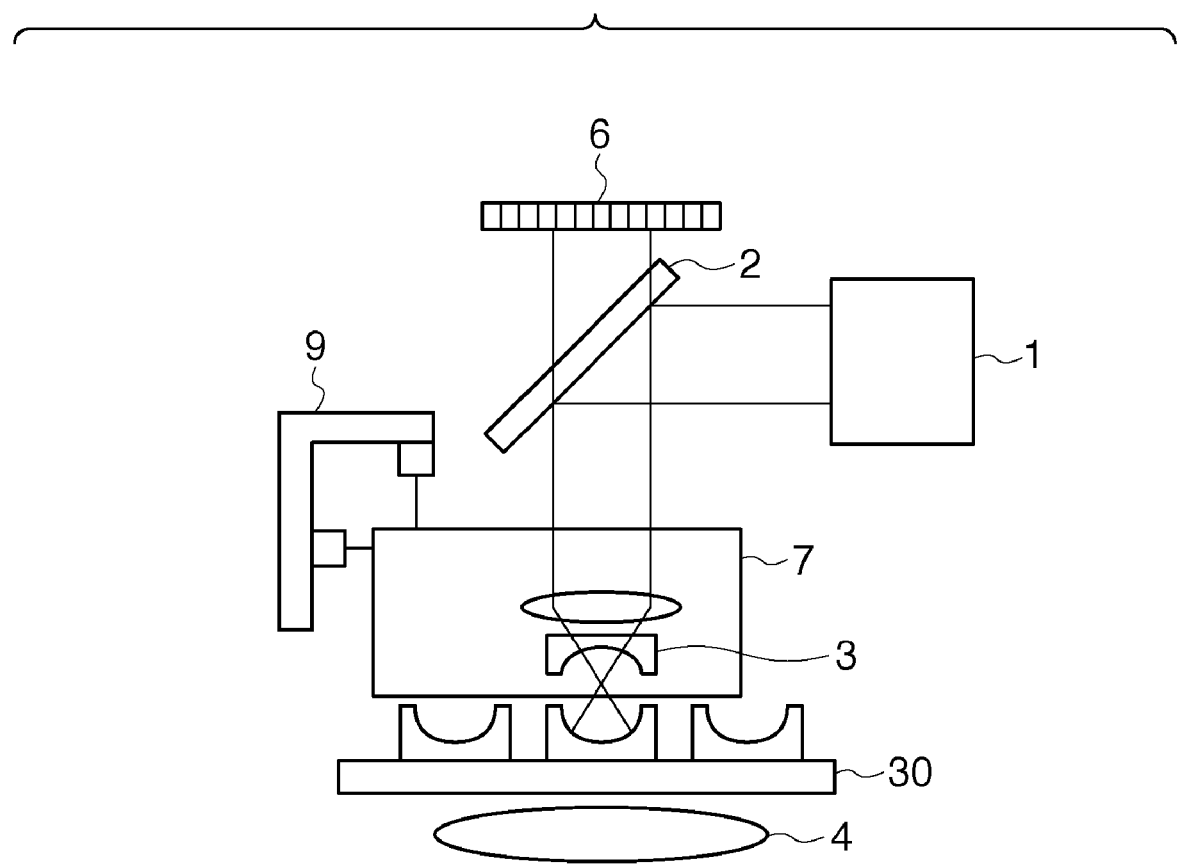
FIG. 4B is a view exemplifying the measurement method according to the second embodiment of the present invention.
Figure 4B:
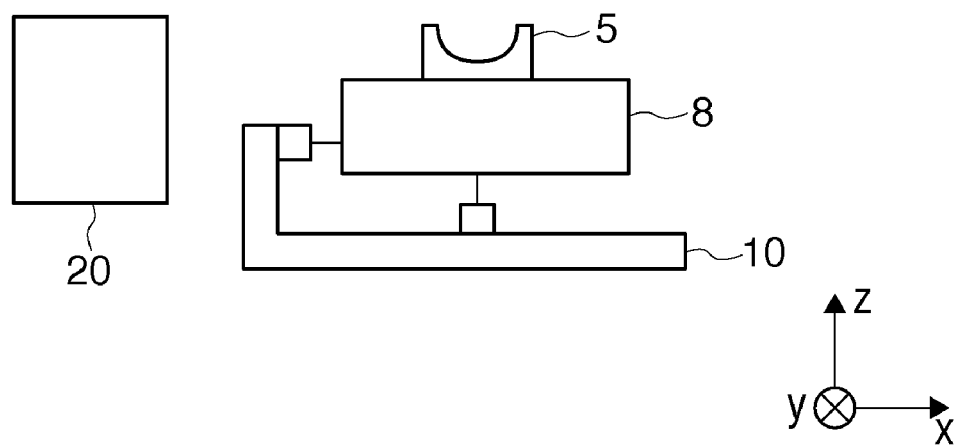
Figure 5A:
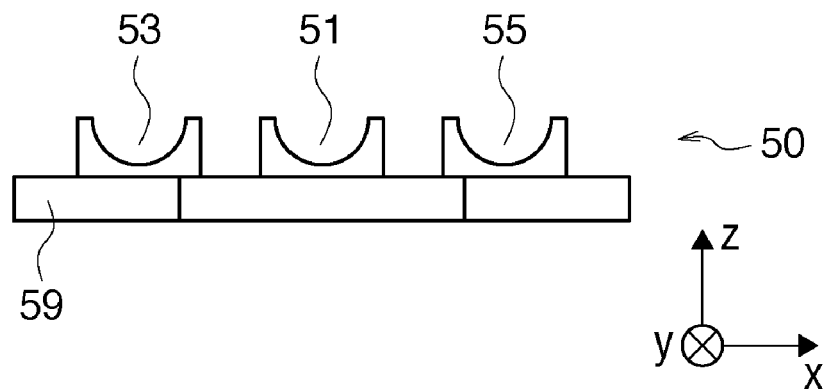
FIGS. 5A and 5B are views illustrating a configuration example of a reflective spherical mirror array suitable for the measurement method according to the second embodiment of the present invention.
Figure 5B:
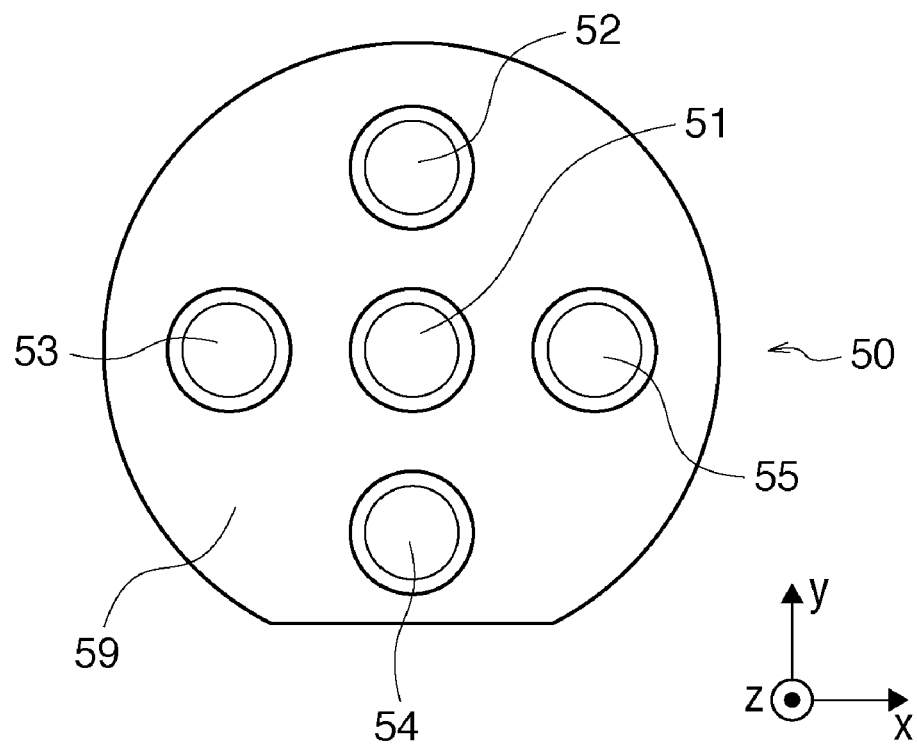

Fourth, the reflective spherical mirror array 50 is rotated through 90° about the optical axis of the optical system 4 while the reflective spherical mirror 51 is set at the center of the reflective spherical mirror array 50, as shown in FIG. 4B. In this arrangement state, the measurement is performed using the reflective spherical mirrors 51, . . . , 55 as in the above-mentioned 0°-arrangement (the arrangement before rotation). By this measurement, positions Oh519, . . . , Oh559 of the object-side stage 7 corresponding to the positions of the centers of curvature of the reflective spherical mirrors 51, . . . , 55 are determined or calculated based on the analysis result of the interference fringes and the values measured by the object-side stage position measurement system 9.

Fifth, directional magnification difference components Eco_0 and Eso_0 in the 0°-arrangement are determined or calculated. Let Oh51I(x, y, z), Oh52I, . . . , Oh55I be the object-side stage positions corresponding to the positions of the centers of curvature of the reflective spherical mirrors 51, . . . , 55 in an ideal reflective spherical mirror array. Let dx(Oh10), dx(Oh20), . . . , dx(Oh50) be the differences in x-coordinates between Oh51I, Oh52I, . . . , Oh55I and Oh510, Oh520, . . . , Oh550. Also, let dy(Oh10), dy(Oh20), . . . , dy(Oh50) be the differences in y-coordinates between Oh51I, Oh52I, . . . , Oh55I and Oh510, Oh520, . . . , Oh550. The directional magnification difference components Eco_0 and Eso_0 in the 0°-measurement are determined or calculated based on dx(Oh10), dx(Oh20), . . . , dx(Oh50) and dy(Oh10), dy(Oh20), . . . , dy(Oh50).

When equations (8) and (9) are rewritten such that their right sides represent the directional magnification difference coefficients, we have:

$$Ec = (dx \cdot x - dy \cdot y)/(x^2 + y^2) \quad (10)$$

$$Es = (dx \cdot y + dy \cdot x)/(x^2 + y^2) \quad (11)$$

Using equations (10) and (11), directional magnification difference coefficients Eco10 and Eso10 calculated from the measurement results obtained by the reflective spherical mirror 51 are given by:

$$Eco10 = (dx(Oh10) \cdot Oh510x - dy(Oh10) \cdot Oh510y)/(Oh510x^2 + Oh510y^2) \text{ and}$$

$$Eso10 = (dx(Oh10) \cdot Oh510y + dy(Oh10) \cdot Oh510x)/(Oh510x^2 + Oh510y^2)$$

where Oh510x and Oh510y are the x- and y-coordinates of the stage position Oh510.

Likewise, directional magnification coefficients Eco20 and Eso20 calculated from the measurement results obtained by the reflective spherical mirror 52 are given by:

$$Eco20 = (dx(Oh20) \cdot Oh520x - dy(Oh20) \cdot Oh520y)/(Oh520x^2 + Oh520y^2) \text{ and}$$

$$Eso20 = (dx(Oh20) \cdot Oh520y + dy(Oh20) \cdot Oh520x)/(Oh520x^2 + Oh520y^2)$$

In the same way, directional magnification difference coefficients Eco30, . . . , Eco50 and Eso30, . . . , Eso510 of the reflective spherical mirrors 53, . . . , 55 are calculated. Average values Eco_0 and Eso_0 of these directional magnification difference coefficients at respective points are calculated by:

$$Eco\_0 = (Eco10 + Eco20 + Eco30 + Eco40 + Eco50)/5 \quad (12)$$

$$Eso\_0 = (Eso10 + Eso20 + Eso30 + Eso40 + Eso50)/5 \quad (13)$$

Subsequently, directional magnification difference components Eco_90 and Eso_90 in the 90°-arrangement are calculated. Let dx(Oh19), dx(Oh29), . . . , dx(Oh59) be the differences in x-coordinates between Oh51I, Oh52I, . . . , Oh55I and Oh519, Oh529, . . . , Oh559. Also, let dy(Oh19), dy(Oh29), . . . , dy(Oh59) be the differences in y-coordinates between Oh51I, Oh52I, . . . , Oh55I and Oh519, Oh529, . . . , Oh559.

The directional magnification difference components Eco_90 and Eso_90 in the 90°-arrangement are calculated as in the calculation for the 0°-arrangement assuming that directional magnification difference coefficients Eco19 and Eso19 calculated from the measurement results obtained by the reflective spherical mirror 51 are given by:

$$Eco19 = (dx(Oh19) \cdot Oh519x - dy(Oh19) \cdot Oh519y)/(Oh519x^2 + Oh519y^2) \text{ and}$$

$$Eso19 = (dx(Oh19) \cdot Oh519y + dy(Oh19) \cdot Oh519x)/(Oh519x^2 + Oh519y^2)$$

In the same way, directional magnification difference coefficients Eco29, . . . , Eco59 and Eso29, . . . , Eso59 of the reflective spherical mirrors 52, . . . , 55 are calculated. Average values Eco_90 and Eso_90 of these directional magnification difference coefficients at respective points are calculated by:

$$Eco\_90 = (Eco19 + Eco29 + Eco39 + Eco49 + Eco59)/5 \quad (14)$$

$$Eso\_90 = (Eso19 + Eso29 + Eso39 + Eso49 + Eso59)/5 \quad (15)$$

Sixth, directional magnification differences Ec_sys and Es_sys attributed to the object-side stage 7 are calculated by:

$$Eco\_sys = (Eco\_0 + Eco\_90)/2 \quad (16)$$

$$Eso\_sys = (Eso\_0 + Eso\_90)/2 \quad (17)$$

Lastly, the distortion aberrations of the optical system 4 are calculated by the conventional distortion aberration measurement method using a reflective spherical mirror 5 while the reflective spherical mirror array 50 is detached from the configuration shown in FIG. 4B. Distortion aberrations Dx(x, y) and Dy(x, y) of the optical system 4, which are free from any directional magnification errors attributed to the object-side stage 7 of the measurement apparatus, are given by:

$$Dx(x,y) = Dxm(x,y) - Eco\_sys \cdot x - Eso\_sys \cdot y \quad (18)$$

$$Dy(x,y) = Dym(x,y) - Eso\_sys \cdot x + Eco\_sys \cdot y \quad (19)$$

where Dxm(x, y) and Dym(x, y) are the measured values of the distortion aberrations at each image height.

This makes it possible to determine or calculate distortion aberrations free from any errors of the measurement system.

The second embodiment is preferably performed together with the first embodiment. In this case, the reflective spherical mirror array 50 is preferably identical to the reflective spherical mirror array 30. Since the measurement while the reflective spherical mirror array is arranged on the object side is common to the first and second embodiments, it is possible to shorten the measurement time as compared to a case in which the measurements are independently performed for each of the first and second embodiments.

Third Embodiment

The third embodiment of the present invention will be explained with reference to FIGS. 6A, 6B, 7A, and 7B. The third embodiment of the present invention reduces any errors of an image-side stage position measurement system 10 corresponding to the directional magnification difference components of the distortion aberrations of an optical system, which are given by equations (8) and (9).

Figure 6A:
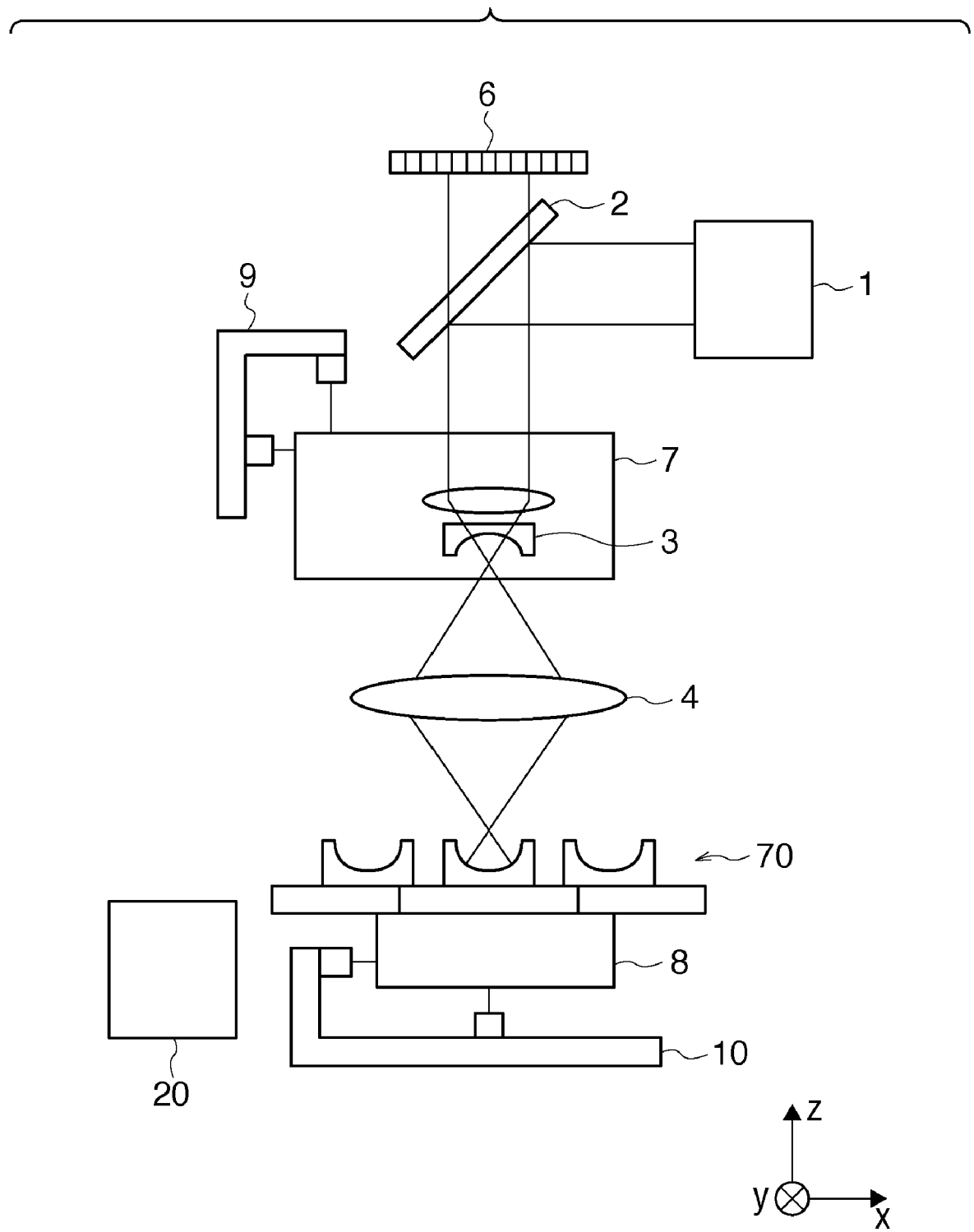
FIG. 6A is a view exemplifying a measurement method according to the third embodiment of the present invention.

The measurement procedure in the third embodiment will be explained below. First, a reflective spherical mirror array 70 serving as an image point measurement device array is arranged on the image side of an optical system 4, as shown in FIG. 6A. Note that the reflective spherical mirror array 70 has a structure in which a plurality of reflective spherical mirrors 71, . . . , 75 serving as image point measurement devices are arranged on a flat plate (support body) 79 while being fixed in positions. The reflective spherical mirror array 70 is arranged such that the center of curvature of the reflective spherical mirror 71 set at the center of the reflective spherical mirror array 70 is aligned on the axis of the optical system 4.

The angle of the reflective spherical mirror array 70 at this time is assumed to be 0°. The plurality of reflective spherical mirrors 71, . . . , 75 are arranged such that the centers of curvature of the reflective spherical mirrors 73, 71, and 75 align themselves on a first straight line at an equal interval, and those of the reflective spherical mirrors 72, 71, and 74 align themselves on a second straight line at an equal interval. The first and second straight lines are orthogonal to each other. The specifications of the reflective spherical mirror array 70, such as the number and arrangement of reflective spherical mirrors, are not limited to those shown in FIGS. 7A and 7B.

Second, an object-side stage 7 is driven to the position at which the object point to be measured is aligned on the axis of the optical system 4. An image-side stage 8 is driven to match the center of curvature of the reflective spherical mirror 71 in the reflective spherical mirror array 70 with an image point in the optical system 4, thereby observing interference fringes in the optical system 4. An image-side stage position Ih710(x, y, z) corresponding to the position of the center of curvature of the reflective spherical mirror 71 is determined or calculated based on the analysis result of the interference fringes and the values measured by the image-side stage position measurement system 10. Image-side stage positions Ih720, Ih730, Ih740, and Ih750 are determined or calculated by the same method.

Figure 6B:
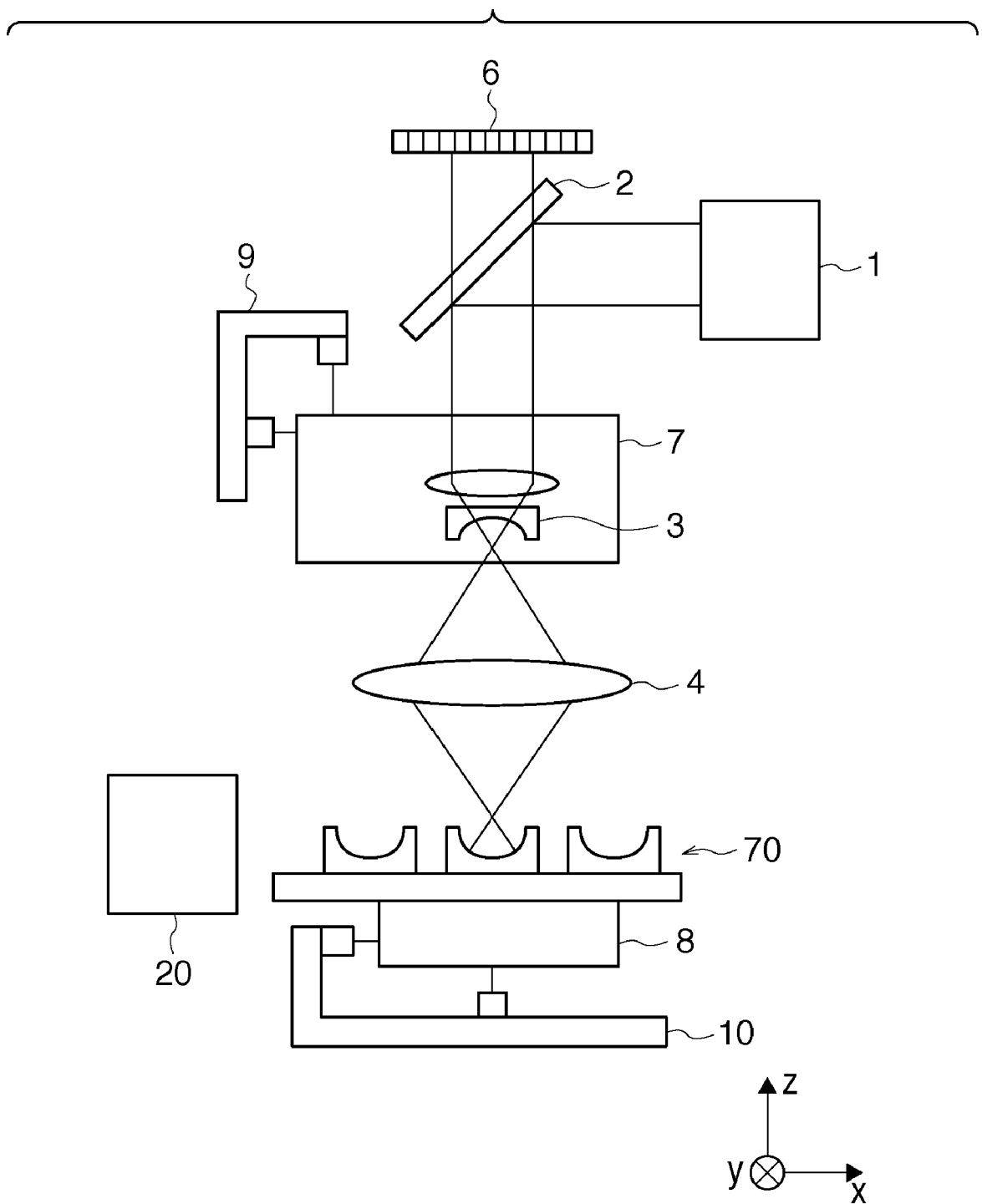
FIG. 6B is a view exemplifying the measurement method according to the third embodiment of the present invention.
Figure 7A:
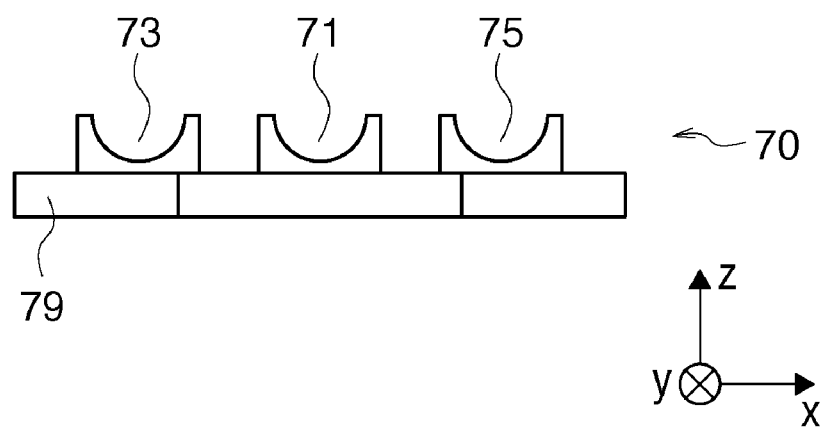
FIGS. 7A and 7B are views illustrating a configuration example of a reflective spherical mirror array suitable for the measurement method according to the third embodiment of the present invention.
Figure 7B:
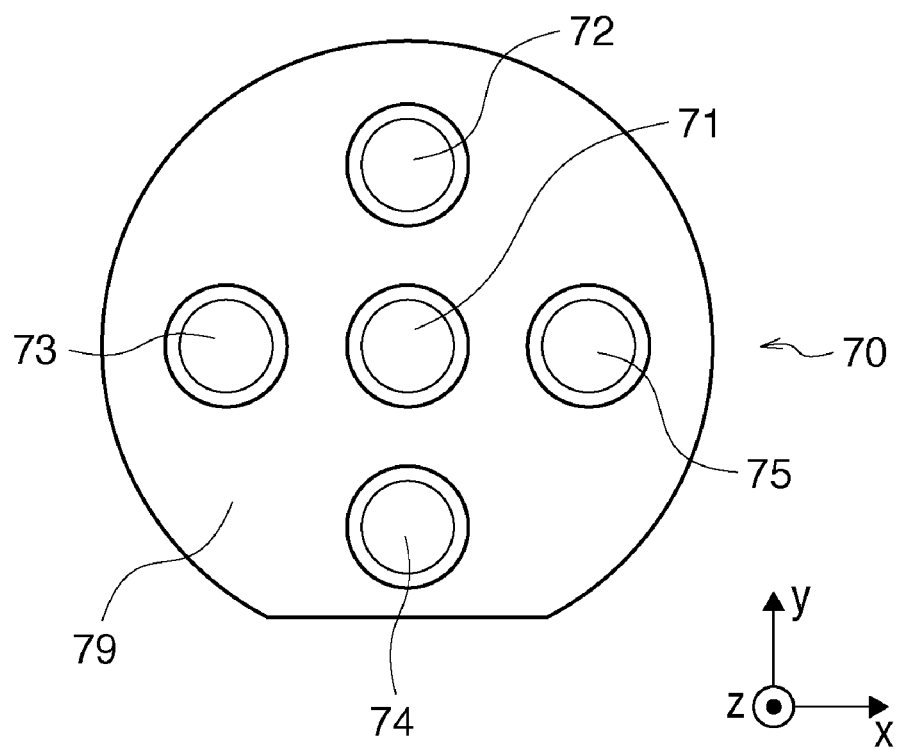

Third, the reflective spherical mirror array 70 is rotated through 90° about the optical axis of the optical system 4 while the reflective spherical mirror 51 is set at the center of the reflective spherical mirror array 50, as shown in FIG. 6B. In this state, interference fringes formed by the optical system 4 are observed using the reflective spherical mirrors 71, . . . , 75 as in the above-mentioned 0°-arrangement. Image-side stage positions Ih719, . . . , Ih759 corresponding to the positions of the centers of curvature of the reflective spherical mirrors 71, . . . , 75 are determined or calculated based on the analysis result of the interference fringes and the values measured by the image-side stage position measurement system 10.

Fourth, directional magnification difference components Eci_) and Esi_0 in the 0°-arrangement are calculated. Let Ih71I(x, y, z), Ih72I, . . . , Ih75I be the image-side stage positions corresponding to the positions of the centers of curvature of the reflective spherical mirrors 71, . . . , 75 in an ideal reflective spherical mirror array. Let dx(Ih10), dx(Ih20), . . . , dx(Ih50) be the differences in x-coordinates between Ih71I, Ih72I, . . . , Ih75I and Ih710, Ih720, . . . , Ih750. Also, let dy(Ih10), dy(Ih20), . . . , dy(Ih50) be the differences in y-coordinates between Ih71I, Ih72I, . . . , Ih75I and Ih710, Ih720, . . . , Ih750.

The directional magnification difference components Eci_0 and Esi_0 in the 0°-arrangement are calculated based on dx(Ih10), dx(Ih20), . . . , dx(Ih50) and dy(Ih10), dy(Ih20), . . . , dy(Ih50).

Using equations (10) and (11), directional magnification difference coefficients Eci10 and Esi10 calculated from the measurement results obtained by the reflective spherical mirror 71 are given by:

$$Eci10=(dx(Ih10)\cdot Ih710x-dy(Ih10)\cdot Ih710y)/(Ih710x^2+Ih710y^2) \text{ and}$$

$$Esi10=(dx(Ih10)\cdot Ih710y+dy(Ih10)\cdot Ih710x)/(Ih710x^2+Ih710y^2)$$

where Ih710x and Ih710y are the x- and y-coordinates of the stage position Ih710.

Likewise, directional magnification coefficients Eci20 and Esi20 calculated from the measurement results obtained by the reflective spherical mirror 72 are given by:

$$Eci20=(dx(Ih20)\cdot Ih720x-dy(Ih20)\cdot Ih720y)/(Ih720x^2+Ih720y^2) \text{ and}$$

$$Esi20=(dx(Ih20)\cdot Ih720y+dy(Ih20)\cdot Ih720x)/(Ih720x^2+Ih720y^2)$$

In the same way, directional magnification difference coefficients Eci30, . . . , Eci50 and Esi30, . . . , Esi50 of the reflective spherical mirrors 73, . . . , 75 are calculated. Average values Eci_0 and Esi_0 of these directional magnification difference coefficients at respective points are calculated by:

$$Eci\_0=(Eci10+Eci20+Eci30+Eci40+Eci50)/5 \tag{20}$$

$$Esi\_0=(Esi10+Esi20+Esi30+Esi40+Esi50)/5 \tag{21}$$

Subsequently, directional magnification difference components Eci_90 and Esi_90 in the 90°-arrangement are calculated. Let dx(Ih19), dx(Ih29), . . . , dx(Ih59) be the differences in x-coordinates between Ih71I, Ih72I, . . . , Ih75I and Ih719, Ih729, . . . , Ih759. Also, let dy(Ih19), dy(Ih29), . . . , dy(Ih59) be the differences in y-coordinates between Ih71I, Ih72I, . . . , Ih75I and Ih719, Ih729, . . . , Ih759. The directional magnification difference components Eci_90 and Esi_90 in the 90°-arrangement are calculated as in the calculation for the 0°-arrangement assuming that directional magnification difference coefficients Eci19 and Esi19 calculated from the measurement results obtained by the reflective spherical mirror 71 are given by:

$$Eci19=(dx(Ih19)\cdot Ih719x-dy(Ih19)\cdot Ih719y)/(Ih719x^2+Ih719y^2) \text{ and}$$

$$Esi19=(dx(Ih19)\cdot Ih719y+dy(Ih19)\cdot Ih719x)/(Ih719x^2+Ih719y^2)$$

In the same way, directional magnification difference coefficients Eci29, . . . , Eci59 and Esi29, . . . , Esi59 of the reflective spherical mirrors 52, ..., 55 are calculated. Average values Eci_90 and Esi_90 of these directional magnification difference coefficients at respective points are calculated by:

$$Eci\_90=(Eci19+Eci29+Eci39+Eci49+Eci59)/5 \qquad (22)$$

$$Esi\_90=(Esi19+Esi29+Esi39+Esi49+Esi59)/5 \qquad (23)$$

Fifth, directional magnification differences Eci_sys and Esi_sys attributed to the image-side stage 8 are calculated by:

$$Eci\_sys=(Eci\_0+Eci\_90)/2 \qquad (24)$$

$$Esi\_sys=(Esi\_0+Esi\_90)/2 \qquad (25)$$

Lastly, the distortion aberrations of the optical system 4 are calculated by the conventional distortion aberration measurement method using the reflective spherical mirror 71 in the configuration shown in FIG. 6B. Distortion aberrations Dx(x, y) and Dy(x, y) of the optical system 4, which are free from any directional magnification errors attributed to the image-side stage 8 of the measurement apparatus, are given by:

$$Dx(x,y)=Dxm(x,y)-Eci\_sys\cdot x-Esi\_sys\cdot y \qquad (26)$$

$$Dy(x,y)=Dym(x,y)-Esi\_sys\cdot x+Eci\_sys\cdot y \qquad (27)$$

where Dxm(x, y) and Dym(x, y) are the measured values of the distortion aberrations at each image height.

This makes it possible to calculate distortion aberrations free from any errors of the measurement system.

The third embodiment is preferably performed together with the first and second embodiments. In this case, the reflective spherical mirror array 70 is preferably identical to the reflective spherical mirror arrays 30 and 50. Since the measurement while the reflective spherical mirror array is arranged on the image side is common to the first and third embodiments, it is possible to shorten the measurement time as compared to a case in which the measurements are independently performed for each of the first and third embodiments.

Fourth Embodiment

The fourth embodiment of the present invention will be explained with reference to FIGS. 8A, 8B, 9A, and 9B. The fourth embodiment reduces any errors attributed to a measurement apparatus corresponding to components of the second and higher orders of the distortion aberrations and the field curvature of an optical system.

Figure 8A:
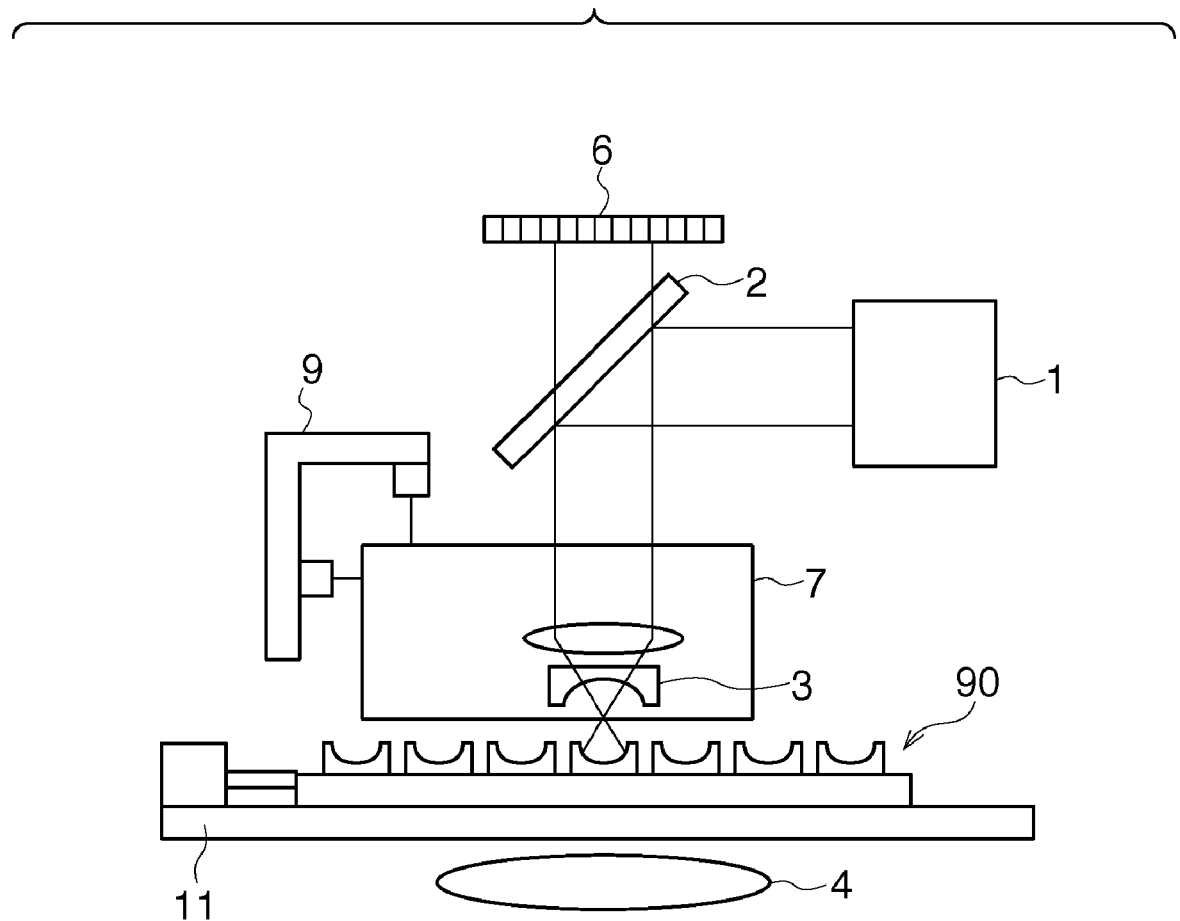
FIG. 8A is a view exemplifying a measurement method according to the fourth embodiment of the present invention.
Figure 8A:
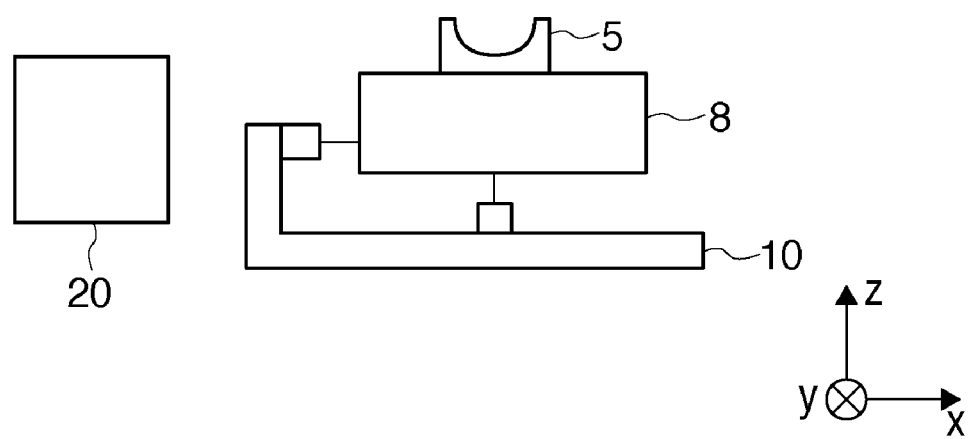
Figure 9A:
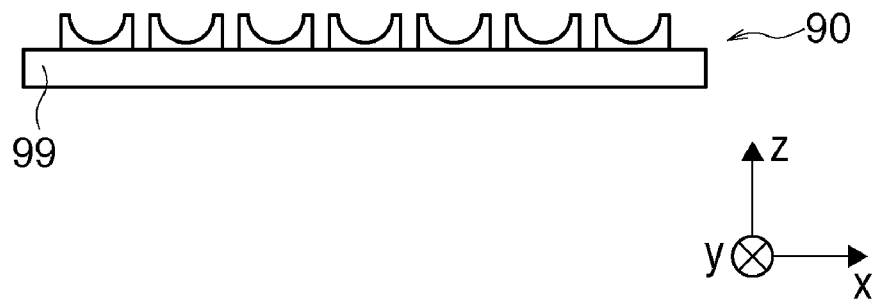
FIGS. 9A and 9B are views illustrating a configuration example of a reflective spherical mirror array suitable for the measurement method according to the fourth embodiment of the present invention.
Figure 9B:
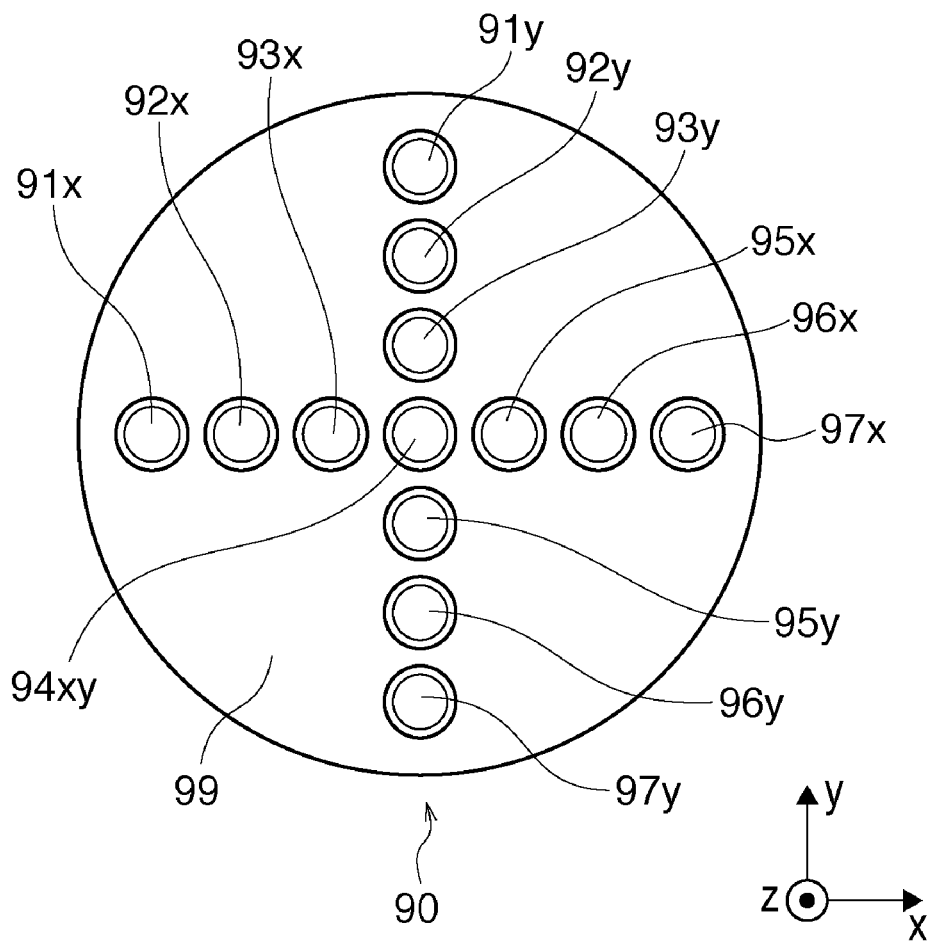

First, a reflective spherical mirror array (object point measurement device array) 90 is arranged such that reflective spherical mirrors (object point measurement devices) 91x, ..., 97x in the reflective spherical mirror array 90 are parallel to the x direction in the object plane, as shown in FIG. 8A. The reflective spherical mirror array 90 has a structure in which 13 reflective spherical mirrors are arranged on a flat plate, as shown in FIGS. 9A and 9B. A reflective spherical mirror 94xy is set at the center of the flat plate. The reflective spherical mirrors 91x, ..., 97x are arranged such that the centers of curvature of them align themselves on a first straight line at an equal interval ΔRSox. Reflective spherical mirrors 91y, ..., 97y are arranged such that the centers of curvature of them align themselves on a second straight line at an equal interval ΔRSoy. The first and second straight lines are orthogonal to each other. The specifications of the reflective spherical mirror array 90, such as the number and arrangement of reflective spherical mirrors, are not limited to those shown in FIGS. 9A and 9B. Note that the number of reflective spherical mirrors on each straight line is preferably large enough to approximate high-order components for evaluating the distortion aberration components.

Second, an object-side stage 7 is driven to match the object point to be measured with the center of curvature of the reflective spherical mirror 91x, thereby observing interference fringes by a photodetector 6. An object-side stage position Oh91x1(x, y, z) corresponding to the center of curvature of the reflective spherical mirror 91x is calculated based on the values measured by an object-side stage position measurement system 9 and the analyzed value of the interference fringes. The object point is matched with the center of curvature of the reflective spherical mirror 92x to calculate an object-side stage position Oh92x1 in the same way. The object point is sequentially matched with the centers of curvature of the reflective spherical mirrors 93x, 94x, ..., 97x to calculate object-side stage positions Oh93x1, Oh94x1, ..., Oh97x1 in the same way.

Figure 8B:
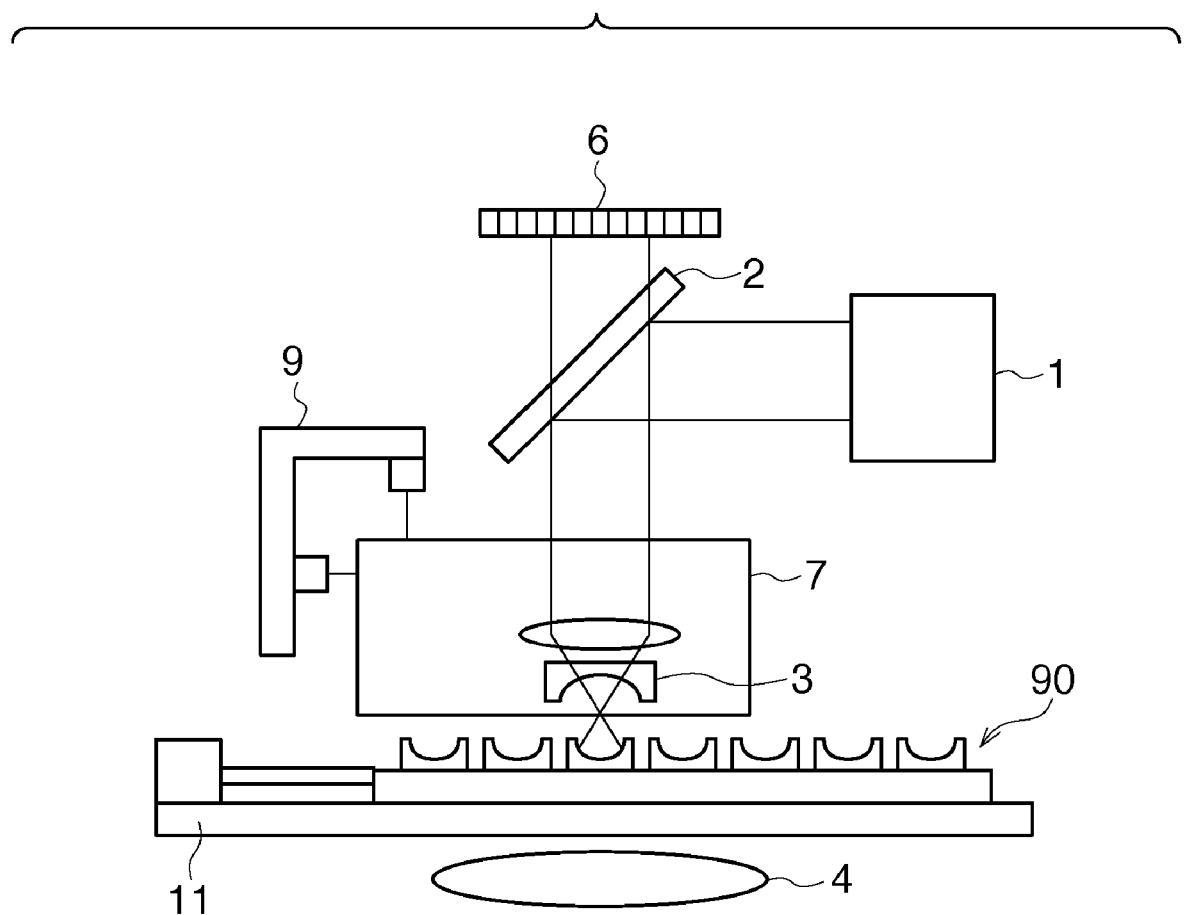
FIG. 8B is a view exemplifying the measurement method according to the fourth embodiment of the present invention.
Figure 8B:
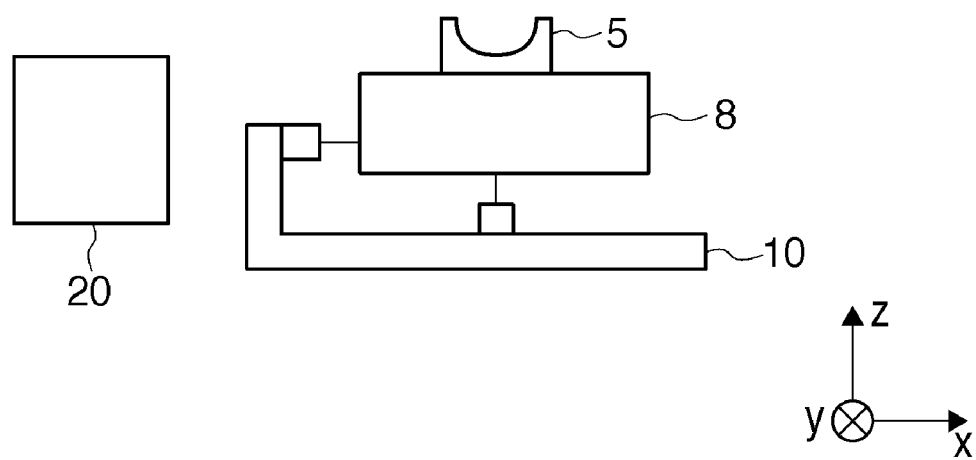

Third, a reflective spherical mirror array driving system 11 drives the reflective spherical mirror array 90 in the x direction at the arrangement interval ΔRSox of the reflective spherical mirrors to set a state shown in FIG. 8B. The object-side stage 7 is driven to match the object point with the center of curvature of the reflective spherical mirror 91x, thereby observing interference fringes by the photodetector 6. An object-side stage position Oh91x2(x, y, z) corresponding to the center of curvature of the reflective spherical mirror 91x is calculated based on the values measured by the object-side stage position measurement system 9 and the analyzed value of the interference fringes. The object point is matched with the center of curvature of the reflective spherical mirror 92x to calculate an object-side stage position Oh92x2 in the same way. The object point is sequentially matched with the centers of curvature of the reflective spherical mirrors 93x, 94x, ..., 97x to calculate object-side stage positions Oh93x2, Oh94x2, ..., Oh97x2 in the same way.

Fourth, errors of high-order Dy components attributed to the object-side stage of the measurement system and the stage position measurement system are calculated based on the measured values Oh91x1, ..., Oh97x1 and Oh91x2, ..., Oh97x2.

The error calculation method will be explained below. Each of measured values Oh9ix1(y) and Oh9ix2(y) is the sum of an error Ody(ox) attributed to the object-side stage/stage position measurement system, an arrangement error Ty(9ix) at an ideal object height y unique to each reflective spherical mirror, and a driving error Sy(p) of the reflective spherical mirror array driving system 11. In other words, the measured values Oh9ix1(y) and Oh9ix2(y) are given by:

$$Oh9ix1(y)=Ody(oxi)+Ty(9ix)+Sy(1) \qquad (28)$$

$$Oh9ix2(y)=Ody(oxi-\Delta RSox)+Ty(9ix)+Sy(2) \qquad (29)$$

where ox is the x position of the object-side stage, i is the number corresponding to each reflective spherical mirror, and p is the position number (1 or 2) of the reflective spherical mirror array driving system.

From equations (28) and (29), we have:

$$\begin{aligned}Oh9ix1(y)-Oh9ix2(y)=&Ody(oxi)-Ody(oxi-\Delta RSox)+\\&(Sy(1)-Sy(2))=Ody(oxi)-Ody(oxi-\Delta RSox)+Cs\end{aligned} \qquad (30)$$

Note that Cs=Sy(1)−Sy(2).

Equation (30) represents a value obtained by adding a constant attributed to errors of the reflective spherical mirror array driving system to the difference value of the Ody components free from the arrangement errors Ty of the reflective spherical mirror.

Integrating equation (30) with respect to the number i yields high-order components of the error Ody(ox).

A field curvature component dz(ox) attributed to the object-side stage can be calculated using its z-coordinate in place of its y-coordinate in the above-mentioned measurement method and calculation method.

An error Odx(oy) of dx attributed to the object-side stage can be calculated using the reflective spherical mirrors $91y, \ldots, 97y$ as in the method using the reflective spherical mirrors $91x, \ldots, 97x$.

Fifth, the reflective spherical mirror array 90 is detached and the distortion aberrations of the optical system are calculated by the conventional distortion aberration measurement method using a reflective spherical mirror 5. Distortion aberrations Dx(x, y) and Dy(x, y) of the optical system, which are free from any distortion aberration components attributed to the object-side stage position measurement system 9 of the measurement apparatus, can be calculated by:

$$Dx(x,y)=Dxm(x,y)-Odx(ox,oy) \qquad (31)$$

$$Dy(x,y)=Dym(x,y)-Ody(ox,oy) \qquad (32)$$

where Dxm(x, y) and Dym(x, y) are the measured values of the distortion aberrations at each image height, and Odx(ox, oy) and Ody(ox, oy) are error components attributed to the object-side stage position measurement system at the object-side stage positions ox and oy corresponding to the image heights x and y. The error components Odx(ox, oy) and Ody(ox, oy) can be measured by the above-mentioned method at the object plane position corresponding to the evaluation image plane position. Alternatively, the error components Odx(ox, oy) and Ody(ox, oy) may be calculated by interpolation using the values measured at object plane positions in the vicinity of the object plane position of interest or calculated from polynomial approximations of the measured values Odx and Ody.

This makes it possible to calculate distortion aberrations free from any errors of the measurement system.

Fifth Embodiment

The fifth embodiment of the present invention will be explained with reference to FIGS. 10A, 10B, 11A, and 11B. The fifth embodiment reduces any errors attributed to a measurement apparatus corresponding to components of the second and higher orders of the distortion aberrations and field curvature of an optical system.

Figure 10A:
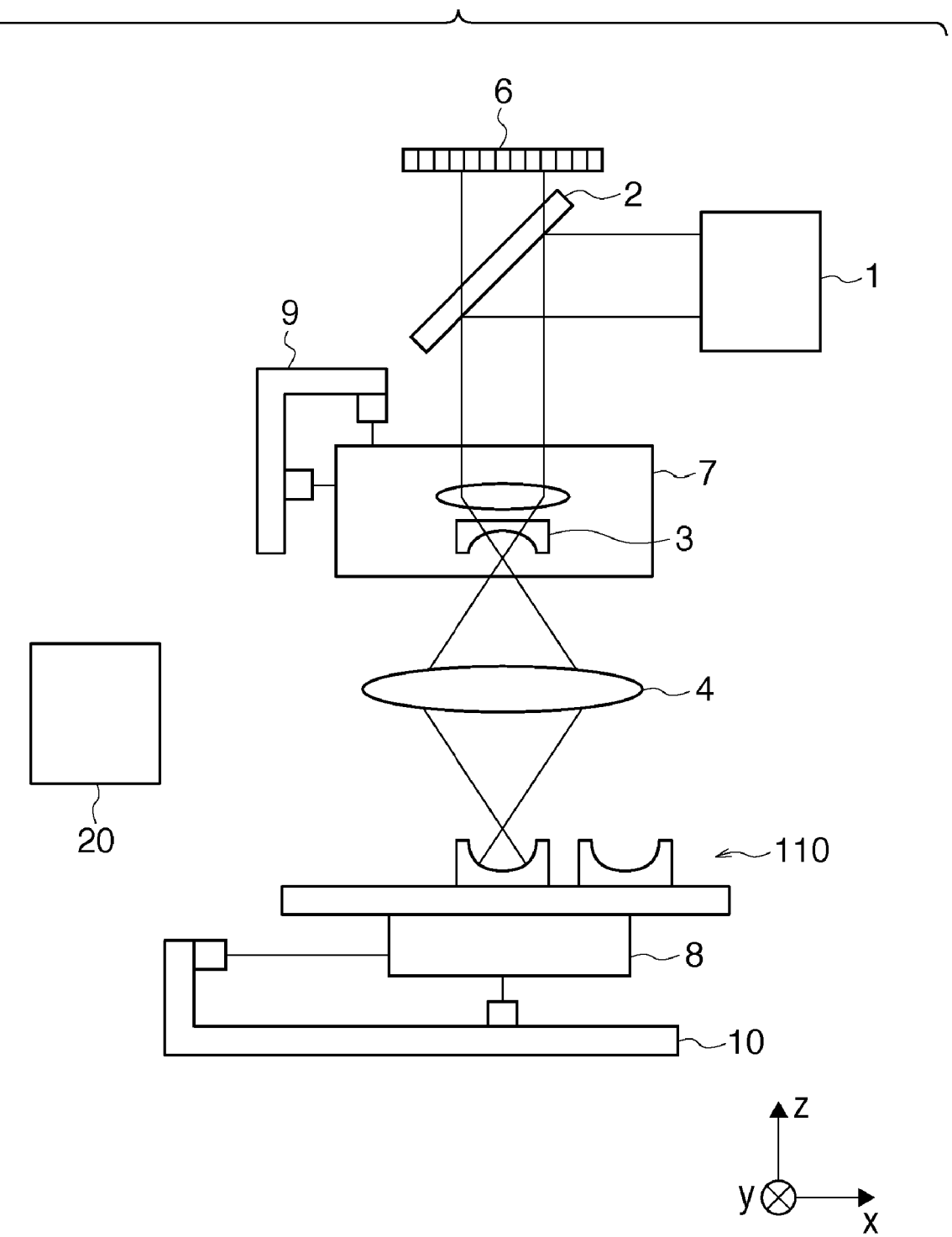
FIG. 10A is a view exemplifying a measurement method according to the fifth embodiment of the present invention.
Figure 10B:
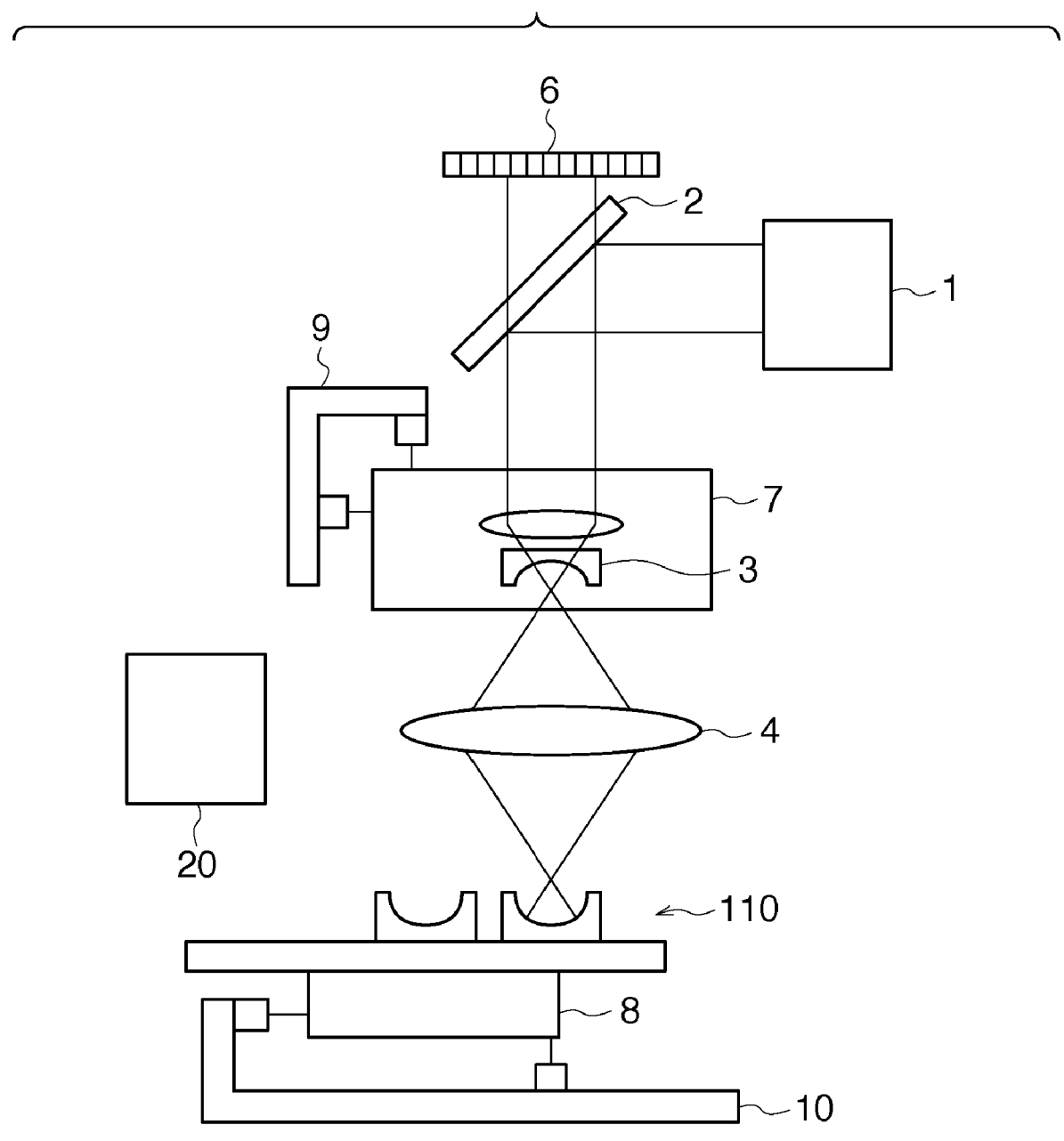
FIG. 10B is a view exemplifying the measurement method according to the fifth embodiment of the present invention.

First, a reflective spherical mirror array (image point measurement device array) 110 is arranged such that a straight line which connects the centers of curvature of reflective spherical mirrors (image point measurement devices) 111 and 113 in the reflective spherical mirror array 110 is parallel to the x direction in the image plane of an optical system 4, as shown in FIG. 10A. An object-side stage 7 is driven to the measurement position of a first object point, wavefront measurement is performed using the reflective spherical mirror 111 in the reflective spherical mirror array 110, and a position Ih1$rs$1 of an image point corresponding to a position Oh1$rs$1 of the first object is measured, thereby calculating an error amount Dy1(x) based on the measurement results.

Figure 11A:
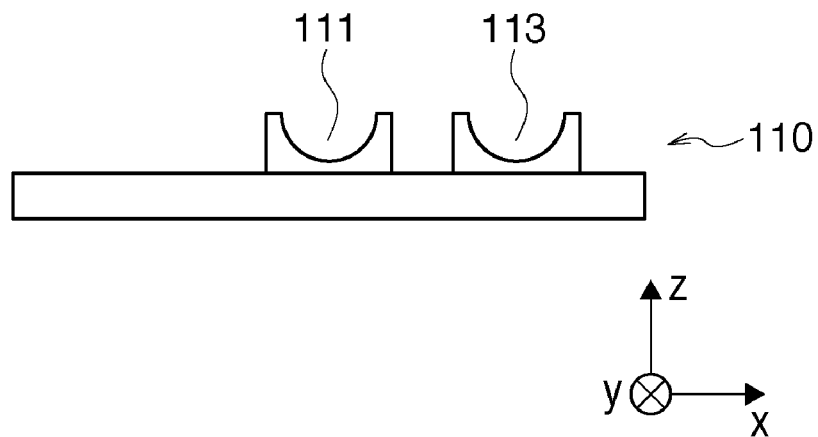
FIGS. 11A and 11B are views illustrating a configuration example of a reflective spherical mirror array suitable for the measurement method according to the fifth embodiment of the present invention.
Figure 11B:
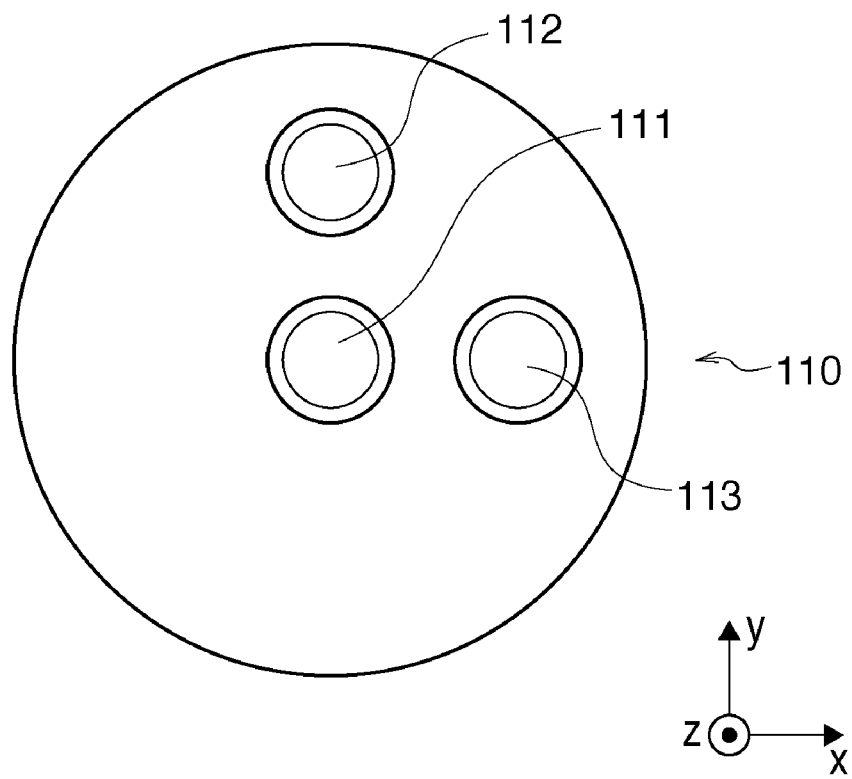

The reflective spherical mirror array 110 has a structure in which three reflective spherical mirrors 111, 112, and 113 are arranged on a flat plate, as shown in FIGS. 11A and 11B. The reflective spherical mirror 111 is set at the center of the reflective spherical mirror array 110. The reflective spherical mirrors 112 and 113 are arranged such that a triangle having its vertices matching the centers of curvature of the three reflective spherical mirrors 111, 112, and 113 is a right triangle in which its side formed between the reflective spherical mirrors 111 and 112 and that formed between the reflective spherical mirrors 111 and 113 form a right angle. The specifications of the reflective spherical mirror array 110, such as the number and arrangement of reflective spherical mirrors, are not limited to those shown in FIGS. 11A and 11B.

Second, an image-side stage 8 is driven while the object point is fixed, and wavefront measurement using the reflective spherical mirror 112 is performed. A position Oh1$rs$2 of the object point and a position Ih1$rs$2 of an image point corresponding to it are measured to calculate a distortion aberration Dy2(x). An interval ΔRSx between the x-coordinates of the reflective spherical mirrors 111 and 112 is calculated by:

$$\Delta RSx=Ih1rs1(x)-Ih1rs2(x) \qquad (33)$$

Third, the object-side stage 7 is driven to the position of a second object point spaced apart from the position of the first object point by ΔRSx/β (β is the imaging magnification of the optical system 4). Distortion aberrations Dy1(x2) and Dy2(x2) are calculated based on object point measured values Oh2$rs$1 and Oh2$rs$2 and image point measured values Ih2$rs$1 and Ih2$rs$2 in the same way as above. Likewise, distortion aberrations Dy1(x3), ..., Dy1(xi) and Dy2(x3), ..., Dy2(xi) at the positions of third to nth object points are obtained while driving the position of the object point by ΔRSx/β.

Fourth, errors of high-order Dy components attributed to the image-side stage of the measurement system and the stage position measurement system are calculated based on the measured values Dy1(x1), ..., Dy1(xi) and Dy2(x1), ..., Dy2(xi).

The error calculation method will be explained below. The measured value Dy(xi) is the sum of a component Idy(xi) attributed to the image-side stage and the stage position measurement system, a component Pdy(xi) attributed to the optical system to be measured, and a component Ody(oxi) attributed to the object-side stage and the stage position measurement system. In other words, the measured value Dy(xi) is given by:

$$Dy1(xi)=Idy(ixi)+Pdy(xi)+Ody(oxi) \qquad (34)$$

$$Dy2(xi)=Idy(ixi+\Delta RSx)+Pdy(xi)+Ody(oxi) \qquad (35)$$

$$Dy1(x(i+1))=Idy(ixi+\Delta RSx)+Pdy(ipxi+\Delta RSx)+Ody(oxi+\Delta RSx/\beta) \qquad (36)$$

$$Dy2(x(i+1))=Idy(ixi+2{*}\Delta RSx)+Pdy(ipxi+\Delta RSx)+Ody(oxi+\Delta RSx/\beta) \qquad (37)$$

where ix is the x position of the image-side stage, x is the x image height in the optical system to be measured, ox is the x position of the object-side stage, and i is the number representing the measurement image height.

In the fifth embodiment, the error component Idy(ixi) attributed to an image-side stage position measurement system at the image-side stage position ixi corresponding to the image height x of the optical system 4 is to be corrected.

From equations (34) and (35), we have:

$$Dy2(xi)-Dy1(xi)=Idy(ixi+\Delta RSx)-Idy(ixi) \qquad (38)$$

Equation (38) corresponds to the difference value, at the interval ΔRSx, of the Idy components free from the Pdy and Ody components. Hence, integrating equation (38) with respect to the number i yields an error component Idy(ix).

A field curvature component dz(ix) attributed to the image-side stage can be calculated using its z-coordinate in place of its y-coordinate in the above-mentioned measurement method and calculation method. An error Idx(iy) of dx attributed to the image-side stage can be calculated using the reflective spherical mirrors 111 and 113 as in the method using the reflective spherical mirrors 111 and 112.

Fifth, the distortion aberrations of the optical system are calculated by the conventional distortion aberration measurement method using the reflective spherical mirror 111 in the reflective spherical mirror array 110.

Distortion aberrations Dx(x, y) and Dy(x, y) of the optical system, which are free from any distortion aberration components attributed to the image-side stage position measurement system of the measurement apparatus, can be calculated by:

$$Dx(x,y)=Dxm(x,y)-Idx(ix,iy) \quad (39)$$

$$Dy(x,y)=Dym(x,y)-Idy(ix,iy) \quad (40)$$

where Dxm(x, y) and Dym(x, y) are the measured values of the distortion aberrations at each image height, and Idx(ix, iy) and Idy(ix, iy) are error components attributed to the image-side stage position measurement system at the image-side stage positions ix and iy corresponding to the image heights x and y. The error components Idx(ix, iy) and Idy(ix, iy) are measured by the above-mentioned method in the image plane matching the evaluation image plane. Alternatively, the error components Idx(ix, iy) and Idy(ix, iy) may be calculated by interpolation using the values measured at image plane positions in the vicinity of the image plane position of interest or calculated from polynomial approximations of the measured values Idx and Idy.

This makes it possible to calculate distortion aberrations free from any errors of the measurement system.

Sixth Embodiment

Figure 12:
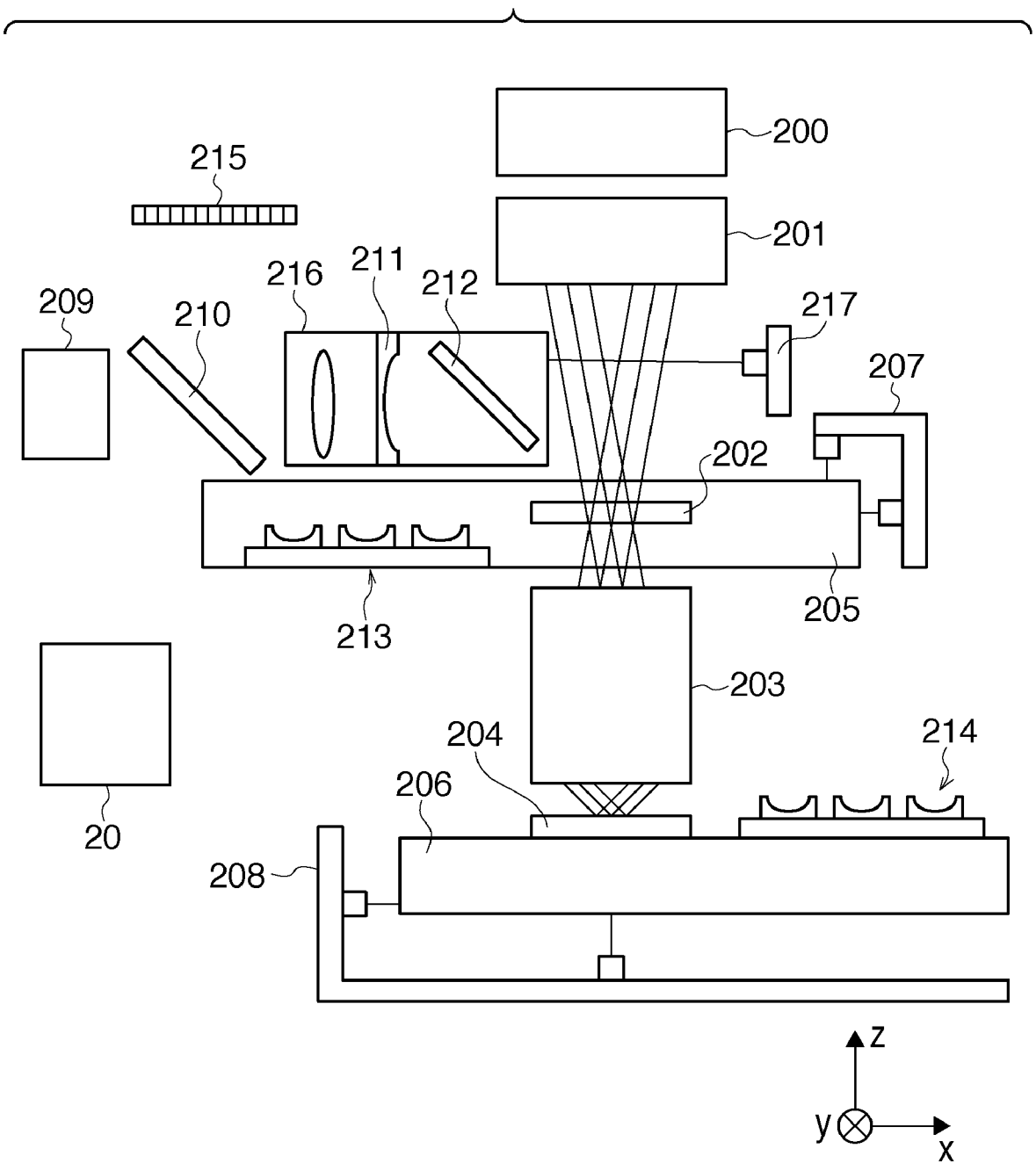
FIG. 12 is a view exemplifying the arrangement of an exposure apparatus according to the sixth embodiment of the present invention.
Figure 13:
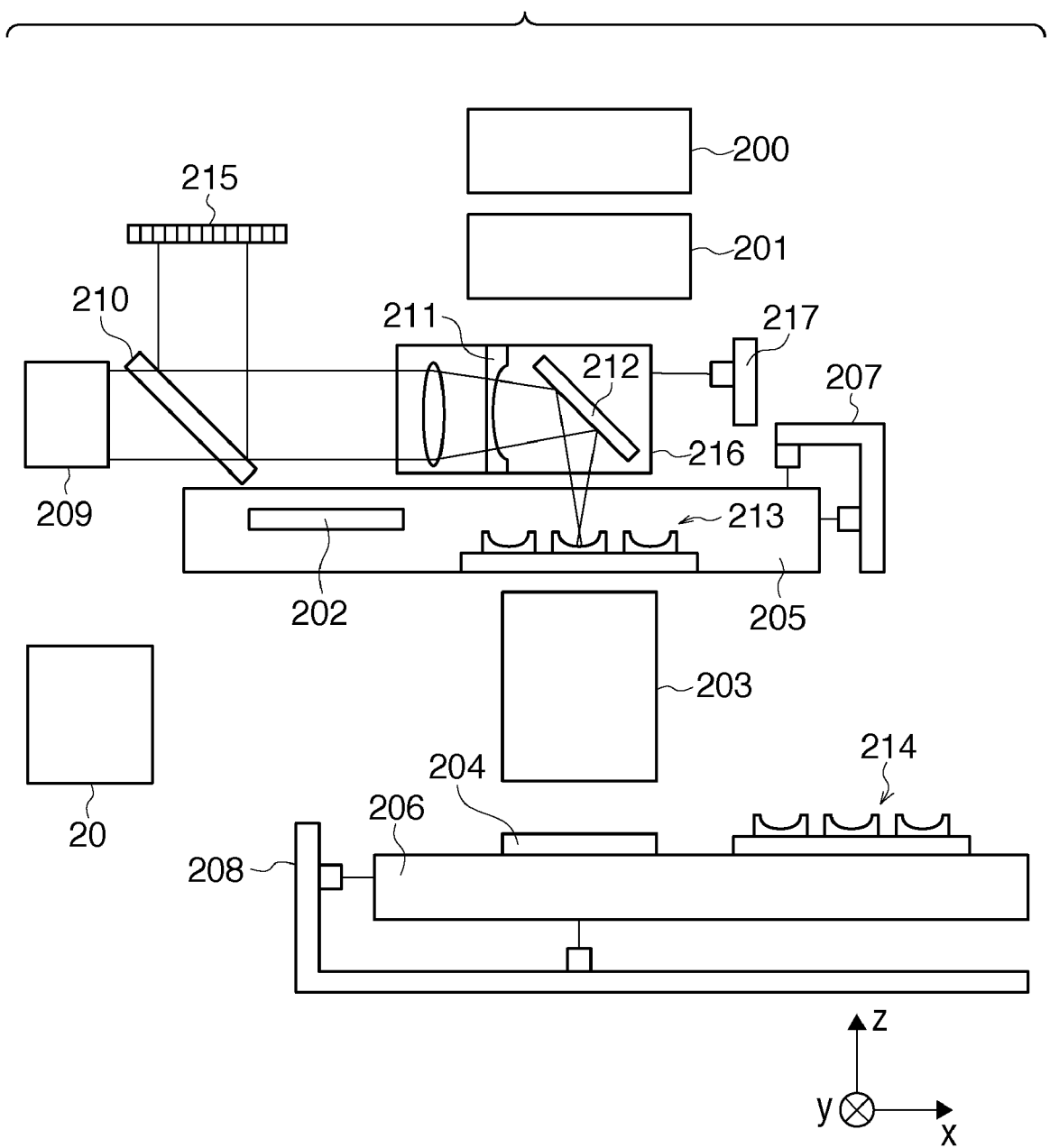
FIG. 13 is a view exemplifying the arrangement of the exposure apparatus according to the sixth embodiment of the present invention.
Figure 14:
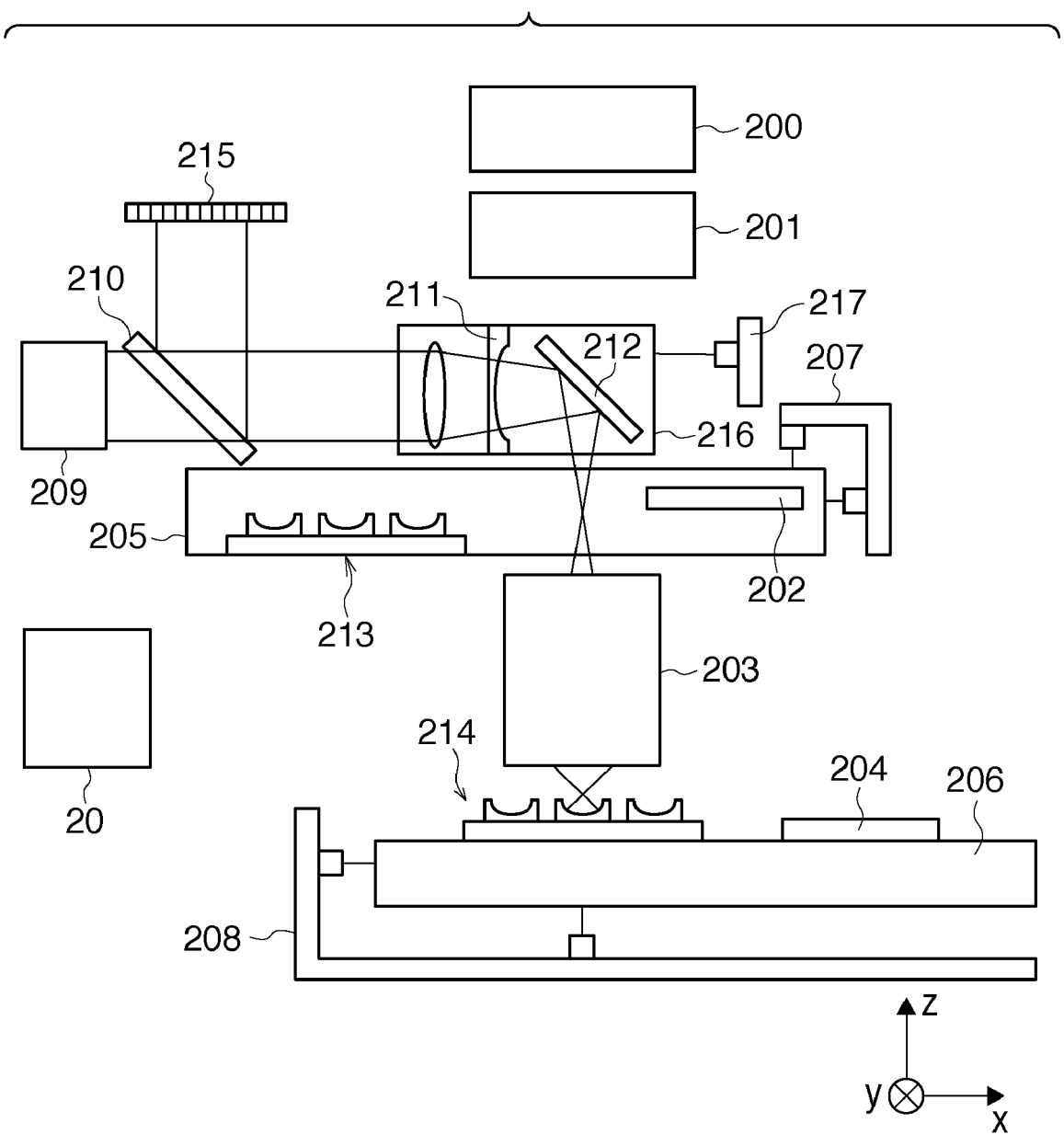
FIG. 14 is a view exemplifying the arrangement of the exposure apparatus according to the sixth embodiment of the present invention.

The sixth embodiment of the present invention will be explained with reference to FIGS. 12 to 14. The sixth embodiment provides a semiconductor exposure apparatus including an arrangement for the optical characteristic evaluation methods according to the first to fifth embodiments. FIGS. 12 to 14 schematically show three states of the semiconductor exposure apparatus according to the sixth embodiment.

An exposure light source 200 and an original illumination optical system 201 illuminate an original (reticle) 202 with, e.g., a set wavelength, illuminance distribution, and object-side NA. The original 202 has a pattern for forming a semiconductor device. The pattern of the original 202 is projected onto a substrate (wafer) 204 by a projection optical system 203 to form a latent image on a photosensitive agent applied on the substrate 204. An original stage 205 which holds the original 202 mounts an object-side reflective spherical mirror array (first reflective spherical mirror array) 213. In measuring the optical characteristics of the projection optical system 203, the original stage 205 is aligned such that the object-side reflective spherical mirror array 213 is inserted in the object plane of the projection optical system 203. The position and direction of the object-side reflective spherical mirror array 213 can be changed by a manipulation mechanism (not shown).

A substrate stage 206 which holds the substrate 204 mounts an image-side reflective spherical mirror array (second reflective spherical mirror array) 214. In measuring the optical characteristics of the projection optical system 203, the substrate stage 206 is aligned such that the image-side reflective spherical mirror array 214 is inserted in the image plane of the projection optical system 203. The position and direction of the image-side reflective spherical mirror array 214 can be changed by driving it by a manipulation mechanism (not shown).

Separately from the exposure light source 200 and the original illumination optical system 201, an optical characteristic evaluation light source 209, a half mirror 210, a TS lens 211, the reflective spherical mirror arrays 213 and 214, and a photodetector 215 configure a Fizeau interferometer for the projection optical system 203. An illumination switching stage 216 is used to switch between illumination by the original illumination optical system 201 and that by an illumination system for optical characteristic evaluation, and to change the position of the object point in the optical performance evaluation. The interferometer configured for the projection optical system is not limited to a Fizeau interferometer, and may be, e.g., a Twyman-Green interferometer. The same light source can be used for the exposure light source and the optical characteristic evaluation light source depending on the type of interferometer configured.

FIG. 12 is a view schematically showing a normal apparatus state in which the pattern of an original is projected onto a substrate by the projection optical system 203. FIG. 13 is a view schematically showing a state in which the object-side reflective spherical mirror array 213 is inserted in the object plane of the projection optical system 203 as the optical system to be measured, and the optical system for illumination is switched to the optical system for optical characteristic evaluation. The use of, for example, a reflective spherical mirror array 50 or 90 in the state shown in FIG. 13 allows the optical characteristic measurement according to the second or fourth embodiment. FIG. 14 is a view schematically showing a state in which the image-side reflective spherical mirror array 214 is inserted in the image plane of the projection optical system 203, and the optical system for illumination is switched to the optical system for optical characteristic evaluation. The use of, for example, a reflective spherical mirror array 70 or 110 in the state shown in FIG. 14 allows the optical characteristic measurement according to the third or fifth embodiment.

In addition, the use of, for example, a reflective spherical mirror array 30 in both the states shown in FIGS. 13 and 14 allows the optical characteristic measurement according to the first embodiment.

Although preferred embodiments of the present invention have been explained above, the present invention is not particularly limited to these embodiments, and various modifications and changes can be made without departing from the spirit and scope of the present invention. For example, the focal point measurement method can be a method which uses a wavefront measurement system other than a Fizeau interferometer, or a so-called aerial image measurement method which measures the intensity distribution near the focal point. In the aerial image measurement method, an image sensor such as a CCD can be used as an object point (image point) measurement device in place of a reflective spherical mirror to calculate the position of an object point (image point) from the image sensed by the image sensor. Furthermore, the measurement procedures explained in the above-mentioned embodiments merely exemplify how to obtain desired measured values, and the embodiments of the present invention are not particularly limited to these procedures.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-114415, filed Apr. 24, 2008, which is hereby incorporated by reference herein in its entirety.

What is claimed is:

1. A method of measuring an optical characteristic of an optical system using a measurement apparatus, the method comprising the steps of:
arranging, on a side of an object plane of the optical system, a plurality of object point measurement devices fixed at predetermined intervals;
obtaining information corresponding to each of positions of the object point measurement devices while sequentially changing an object point measurement device to be used for measurement, wherein information corresponding to a position of each of the object point measurement devices is obtained by changing an object point within the object plane of the optical system such that light from the object point enters a corresponding object point measurement device and performing measurement using the corresponding object point measurement device;
arranging, on a side of an image plane of the optical system, a plurality of image point measurement devices fixed at predetermined intervals;
obtaining information corresponding to each of positions of the image point measurement devices while sequentially changing an image point measurement device to be used for measurement, wherein information corresponding to a position of each of image point measurement devices is obtained by changing the object point within the object plane of the optical system such that light from the object point enters a corresponding image point measurement device and performing measurement using the corresponding image point measurement device;
calculating an error attributed to the measurement apparatus based on information corresponding to each of the positions of the object point measurement devices and information corresponding to each of the positions of the image point measurement devices;
obtaining information representing the optical characteristic of the optical system using the measurement apparatus while changing the object point plural times within the object plane and performing measurement for each object point; and
correcting the measured value based on the error.

2. The method according to claim 1, wherein the plurality of object point measurement devices are arranged on a first straight line and a second straight line vertical to the first straight line at equal intervals.

3. The method according to claim 1, wherein
at least one of the object point measurement devices is a reflective spherical minor, and
information corresponding to a position of the reflective spherical mirror by measuring an interference fringe formed by reference light and light from the reflective spherical minor.

4. The method according to claim 1, wherein the error includes an error which appears as a magnification component of the optical system.

5. The method according to claim 1, wherein an object point measurement device array including the plurality of object point measurement devices is rotated about an optical axis of the optical system to change arrangement states of the plurality of object point measurement devices and the information corresponding to each of positions of the object point measurement devices is obtained in both the arrangement states before the change and after the change.

6. The method according to claim 1, wherein an object point measurement device array including the plurality of object point measurement devices is translated in the object plane of the optical system to change an arrangement state of the plurality of object point measurement devices and the information corresponding to each of positions of the object point measurement devices is obtained in both the arrangement states before the change and after the change.

7. The method according to claim 1, wherein the optical system includes a projection optical system which projects a pattern of an original onto a substrate to expose the substrate.

8. The method according to claim 1, wherein the plurality of image point measurement devices are arranged on a third straight line and a fourth straight line vertical to the third straight line at equal intervals.

9. The method according to claim 1, wherein an image point measurement array including the plurality of image point measurement devices is rotated about an optical axis of the optical system to change arrangement states of the plurality of image point measurement devices, and the information corresponding to each of positions of the image point measurement devices is obtained in both the arrangement states before the change and after the change.

10. The method according to claim 1, wherein the plurality of object point measurement devices are fixed on a support.

11. The method according to claim 1, wherein the plurality of object point measurement devices and the plurality of image point measurement devices are same with each other.

12. A measurement apparatus which measures an optical characteristic of an optical system, the apparatus comprising:
a stage movable to change an object point of the optical system within an object plane of the optical system;
a plurality of object point measurement devices arranged on a side of the object plane of the optical system, light from the object point entering the object point measurement devices;
a first support configured to support the plurality of object point measurement devices at predetermined intervals;
a plurality of image point measurement devices arranged on a side of an image plane of the optical system; and
a second support configured to support the plurality of image point measurement devices at predetermined intervals,
wherein the stage is moved to change the object point within the object plane of the optical system such that light from the object point sequentially enters the object point measurement devices.

* * * * *